US008569090B2

(12) United States Patent
Taheri

(10) Patent No.: US 8,569,090 B2

(45) Date of Patent: Oct. 29, 2013

(54) WAFER LEVEL STRUCTURES AND METHODS FOR FABRICATING AND PACKAGING MEMS

(76) Inventor: Babak Taheri, San Francisco, CA (US)

( * ) Notice: Subject to any disclaimer, the term of this patent is extended or adjusted under 35 U.S.C. 154(b) by 63 days.

(21) Appl. No.: 13/306,679

(22) Filed: Nov. 29, 2011

(65) Prior Publication Data

US 2012/0142144 A1 Jun. 7, 2012

Related U.S. Application Data

(60) Provisional application No. 61/419,670, filed on Dec. 3, 2010.

(51) Int. Cl.
*H01L 21/00* (2006.01)
*H01L 21/30* (2006.01)

(52) U.S. Cl.
USPC .............................................. 438/51; 438/456

(58) Field of Classification Search
None
See application file for complete search history.

(56) References Cited

U.S. PATENT DOCUMENTS

| | | | | |
|---|---|---|---|---|
| 5,837,562 | A * | 11/1998 | Cho | 438/51 |
| 6,924,165 | B2 * | 8/2005 | Horning et al. | 438/48 |
| 7,238,999 | B2 * | 7/2007 | LaFond et al. | 257/417 |
| 7,696,622 | B2 * | 4/2010 | Takemoto et al. | 257/729 |
| 8,043,897 | B2 | 10/2011 | Lee et al. | |
| 2006/0063462 | A1 * | 3/2006 | Ding et al. | 445/25 |
| 2010/0052082 | A1 | 3/2010 | Lee et al. | |

* cited by examiner

*Primary Examiner* — Scott B Geyer

(57) ABSTRACT

Methods of fabricating a Micro-Electromechanical System (MEMS) in a hermetically sealed cavity formed at a substrate level are provided. Generally, the method comprises: (i) forming a number of first open cavities in a surface of a first substrate and a number of second open cavities in a surface of a second substrate corresponding to the first open cavities; (ii) forming an actuator/sensor layer including a number of MEMS devices with electrically conductive regions therein; (iii) bonding the first substrate and the second substrate to the actuator/sensor layer so that at least one of the number of the first and second open cavities align with at least one of the number of MEMS devices to form a sealed cavity around the MEMS; and (iv) electrically connecting the electrically conductive regions of the MEMS device to a pad outside of the sealed cavity through an electrical interconnect. Other embodiments are also described.

22 Claims, 18 Drawing Sheets

WAFER LEVEL STRUCTURES AND METHODS FOR FABRICATING AND PACKAGING MEMS

CROSS-REFERENCE TO RELATED APPLICATIONS

The present application claims the benefit of priority under 35 U.S.C. 119(e) to U.S. Provisional Patent Application Ser. No. 61/419,670 entitled “Wafer Level Methods and Structures for Fabricating and Packaging MEMS,” filed Dec. 3, 2010, which application is hereby incorporated by reference in its entirety.

TECHNICAL FIELD

The present invention relates generally to Micro-Electromechanical Systems (MEMS), and more particularly to wafer level methods and structures for fabricating and packaging MEMS actuators and/or sensors.

BACKGROUND

MEMS have been developed for numerous applications, including sensors such as accelerometers, gyroscopes, pressure sensors, and magnetic sensors, actuators such as atomic force microscopy (AFM) probe tips, micro mirrors, energy harvesters, resonators, motors, and passive programmable components such as Variable Capacitors, Inductors, Resistors, and RF switches or resonators. Typically, the MEMS is electrically coupled to an integrated circuit (IC), such as a complementary-metal-oxide-semiconductor (CMOS) IC, to drive the actuators or readout and amplify signals from the sensors. Conventional approaches to manufacturing combined or hybrid CMOS/MEMS have focused on either integrally forming the CMOS IC adjacent to a MEMS on a shared surface of a silicon wafer or substrate, or forming the CMOS IC and MEMS on separate substrates and bonding the MEMS substrate over a cavity formed in the CMOS IC substrate followed by partial removal of the MEMS substrate to expose pads on the CMOS IC. Although both approaches can provide hybrid CMOS/MEMS neither are wholly satisfactory.

In particular, integrally forming the CMOS IC and MEMS on a shared silicon substrate is problematic as the thin film functional layers of the MEMS tend to have thermal properties incompatible with those of the CMOS IC, and as a result require expensive calibration and compensation techniques, or large yield loss of the CMOS due to damage caused during processing. In addition, because the MEMS is not covered and protected at the wafer or substrate level, there is substantial risk of damaging the MEMS during fabrication of the CMOS IC and/or during die singulation.

Bonding the MEMS substrate over a cavity formed in the CMOS IC substrate is problematic in that the cavity wastes CMOS silicon area and the wet etch or deep reactive ion etch (DRIE) commonly used to form the cavity could damage CMOS circuitry (e.g., electrostatic damage, overheating damage), lowering the yield. Moreover, the MEMS substrate and CMOS IC substrate are bonded using processes that requires expensive equipment, is difficult to control, and often results in incomplete die bond formation across wafer including center or edge effects, lowering bonding yield. In addition, these bonding processes are generally non-compatible with typical CMOS foundry processes, and exposing pads on the CMOS IC requires either sawing or mechanical removal of excess silicon, hence lowering yield.

Accordingly there is a need for a wafer level integration of MEMS and CMOS ICs that is compatible with both MEMS and CMOS foundry processes, does not require expensive or exotic processing equipment or techniques, and provides a hermetically sealed package at wafer level with electrical connections to the outside of the sealed package, and can be singulated at die level, without reducing yield.

SUMMARY

Methods of fabricating and packaging a Micro-Electromechanical Systems (MEMS) in a hermetically sealed cavity formed at a wafer level are provided. Generally, the method comprises: (i) forming a number of first open cavities in a surface of a first substrate and a number of second open cavities in a surface of a second substrate corresponding to the first open cavities; (ii) forming an actuator/sensor layer including a number of MEMS devices with electrically conductive regions therein; (iii) bonding the first substrate and the second substrate to the actuator/sensor layer so that at least one of the number of the first and second open cavities align with at least one of the number of MEMS devices to form a sealed cavity around the MEMS; and (iv) electrically connecting the electrically conductive regions of the MEMS device to a pad outside of the sealed cavity through an electrical interconnect. In one embodiment, electrical interconnect includes a lateral contact structure in contact with the electrically conductive regions of the MEMS device extending from the hermetically sealed cavity between the actuator/sensor layer and the first or second substrate, and electrically connecting the electrically conductive regions of the MEMS device to a pad outside of the sealed cavity is accomplished by exposing a portion of the lateral contact structure. In another embodiment, electrically connecting the electrically conductive regions of the MEMS device to the pad is accomplished by forming a silicon via through either the first or second substrate to the electrically conductive regions of the MEMS device. Other embodiments are also provided.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed to methods and structures for fabricating and packaging a Micro-Electromechanical Systems (MEMS) in a hermetically sealed cavity formed at a wafer or substrate level.

A method of fabricating and packaging a MEMS or actuator and sensor platform, such as a Taheri Actuator and Sensor Platform (TASP™), according to one embodiment will now be described with reference to the block diagrams of FIGS. 1A-1H, and the flow chart of FIG. 2.

Figure 1A:
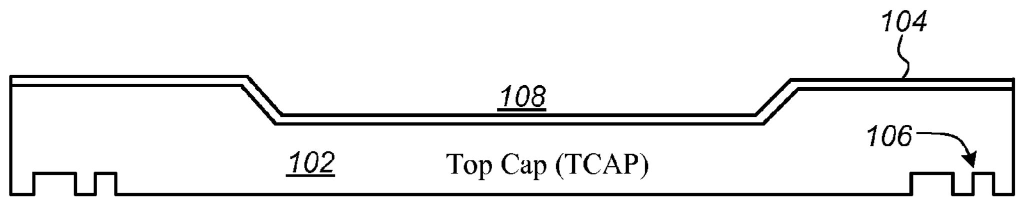
FIGS. 1A-1H are block diagrams in sectional side view of intermediate structures in the fabrication of a Micro-Electromechanical Systems (MEMS) comprising three wafer level substrates and conductive vias according to one embodiment.
Figure 2:
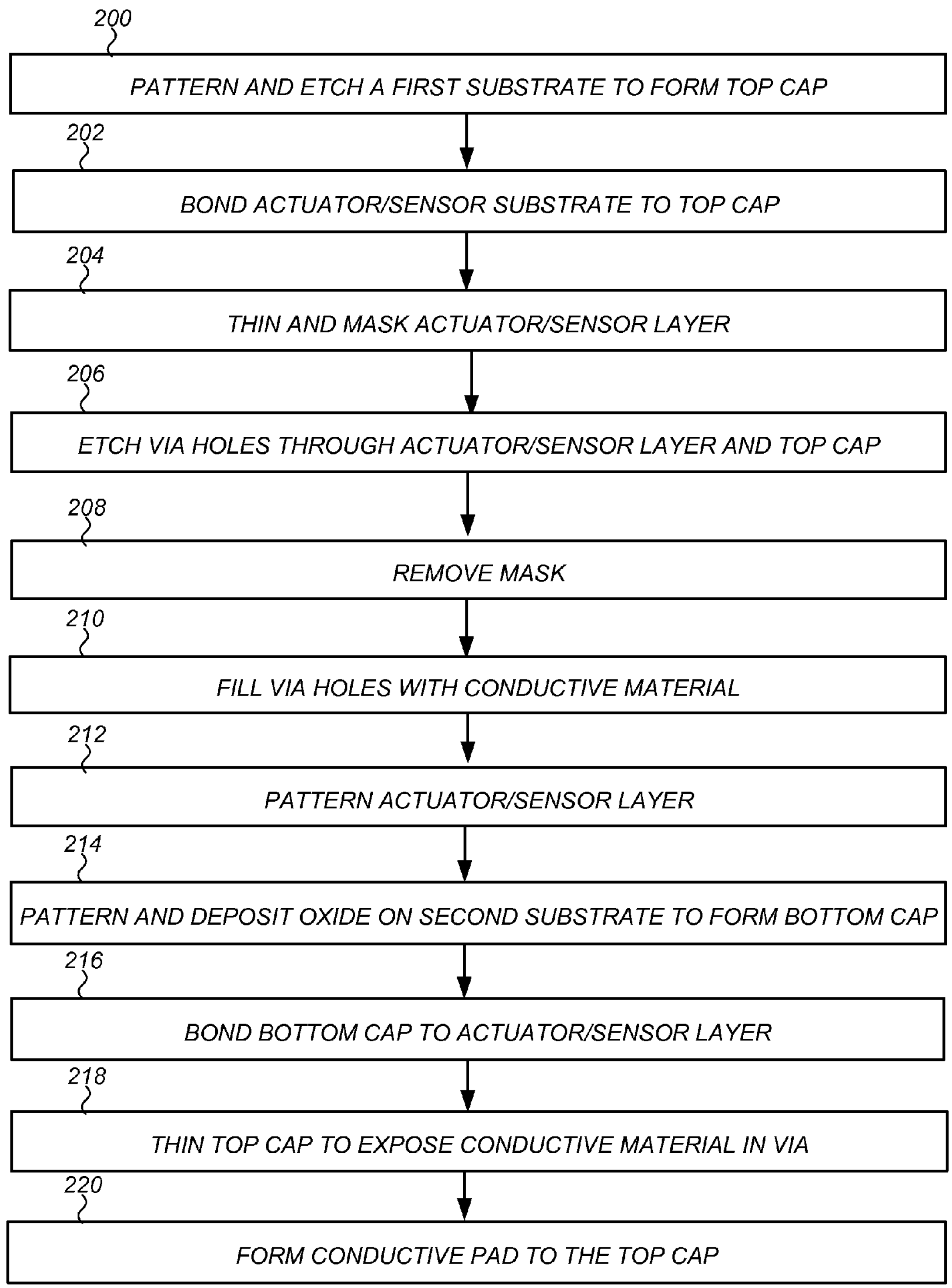
FIG. 2 is a flow chart illustrating a method for fabricating a MEMS of FIGS. 1A-1H according to one embodiment.

Referring to FIG. 1A and FIG. 2, the method begins with patterning, and etching a first substrate 102 to form a top cap (TCAP) (step 200). Optionally, as shown in FIG. 1A this step can further include depositing a bonding material 104, such as an oxide, thereon to facilitate subsequent fusion or eutectic bonding. Generally, the substrate 102 includes a number of alignment marks or features 106, and is patterned or etched using either an isotropic etching such as KOH or anisotropic etching such as reactive ion etch (RIE) or a deep reactive ion etch (DRIE) and standard photolithographic techniques.

Figure 1B:
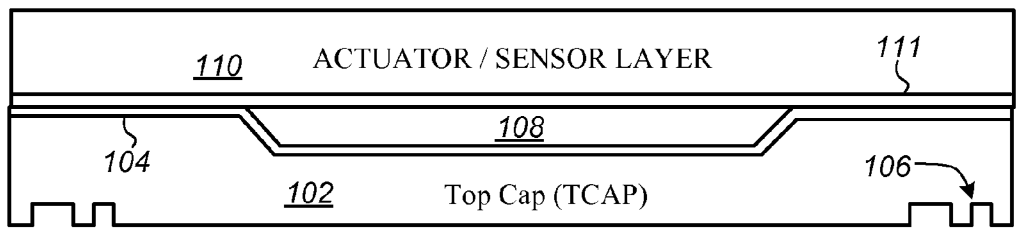

Referring to FIG. 1B and FIG. 2, an actuator/sensor layer 110 is bonded to the top cap 102 (step 202). The bonding can be accomplished using fusion bonding in case of oxide or silicon to oxide bonding, eutectic bonding, anodic bonding, or glass frit bonding, depending on the materials of the first substrate 102, the bonding material 104, the materials of actuator/sensor layer 110, and on the application or function of the MEMS being fabricated. For example, the first substrate 102 can include a semiconductor substrate, such as doped or undoped silicon, or glass, and the actuator/sensor layer 110 can include a thin substrate or layer of silicon or glass, and in addition can include one or more layers of bonding material, insulating or dielectric material, metal or conducting layers, reflective or mechanical tensile layers, such as silicon-nitride ($Si_xN_y$) or titanium-nitride (TiN). Where the MEMS being fabricated is an optical sensor or actuator (micro mirror) the first substrate 102 can comprise a glass substrate or wafer.

In one embodiment, the first substrate 102 is bonded to the actuator/sensor layer 110 using fusion bonding, and the bonding material 104 deposited on the substrate can include a thin layer of one or more of silicon-oxide ($SiO_2$), silicon (Si) or silicon-nitride ($Si_xN_y$), depending on the material of the actuator/sensor layer, to form a $SiO_2$ to $SiO_2$, $SiO_2$ to Si or $Si_xN_y$ to $Si_xN_y$, or $SiO_2$ to Si fusion bond. Optionally, as in the embodiment shown, the actuator/sensor layer 110 may also include one or more layer of fusion bonding material 111 formed on a surface facing the TCAP. Where the first substrate 102 is bonded to the actuator/sensor layer 110 using eutectic, polymer bonding (e.g., SU-8), or anodic bonding, bonding materials deposited on the substrate and/or the actuator/sensor layer can include aluminum (Al), copper (CU), gold (AU), germanium (Ge), tungsten (W), silicon (Si) or mixtures or alloys thereof.

Figure 1C:
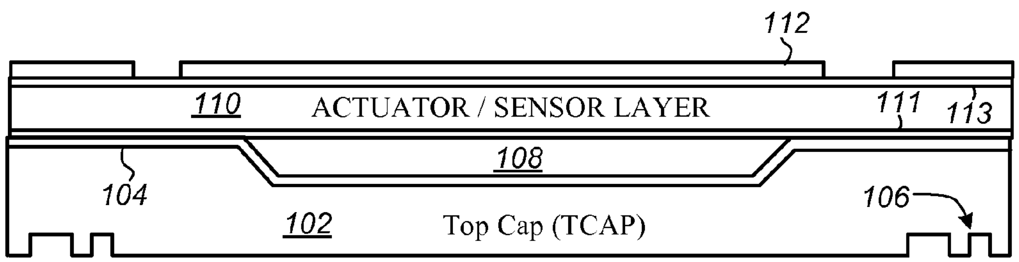
Figure 1D:
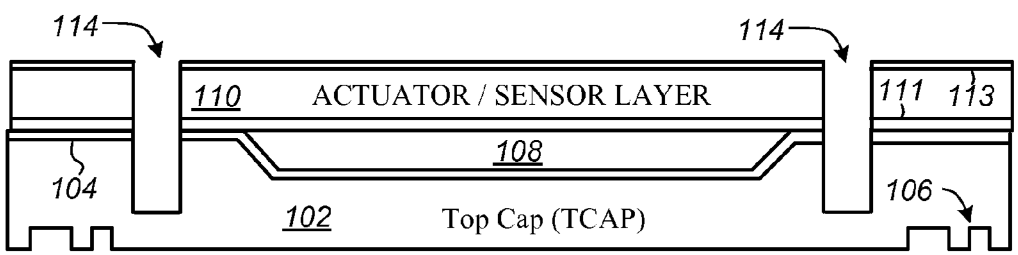
Figure 1E:
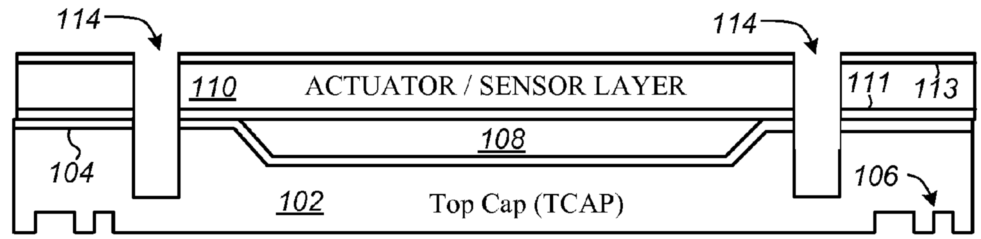

Referring to FIG. 1C and FIG. 2, the actuator/sensor layer 110 is thinned and a patterned mask layer 112 formed thereon (step 204). Optionally, as in the embodiment shown, prior to forming the mask layer 112 one or more layer of fusion bonding material 113 can be formed on a surface of the actuator/sensor layer 110 that will face the BCAP. The actuator/sensor layer 110 can be thinned, for example, by lapping, grinding or chemical mechanical planarization/polishing (CMP). The mask layer 112 can formed from photoresist, oxide, nitride or any other complementary metal oxide semiconductor integrated circuit (CMOS) compatible masking material and patterned using standard photolithographic, deposition and etch techniques. Referring to FIG. 1D, a number of via openings or holes 114 are etched through the actuator/sensor layer 110 and into or substantially through the first substrate 102 or TCAP using RIE or DRIE (step 206) or other etching techniques depending on the TCAP and bonding material. Next, the mask layer 112 is removed (step 208) as shown in FIG. 1E.

Figure 1F:
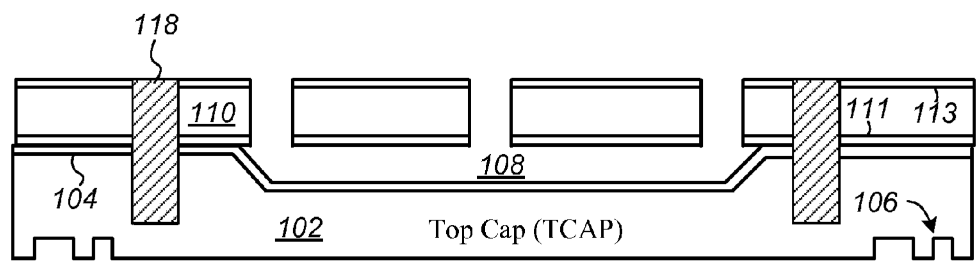

Referring to FIG. 1F and FIG. 2, the via holes 114 are filled with a conductive material, such as a conductive paste, polysilicon (poly) or a metal such as copper (step 210) or tungsten to form a number of silicon vias 118 extending from the actuator/sensor layer 110 and into or substantially through the first substrate 102 or TCAP. Metal can be deposited, for example, by an evaporation or chemical vapor deposition (CVD) process. Optionally or preferably, the filling of the via holes 114 is preceded by deposition of a thin layer of a barrier metal, such as tungsten (W), Ti or TiN, in the via holes. Next, the actuator/sensor layer 110 is patterned, thinned or micromachined to form a number of MEMS actuators or sensors in the functional actuator/sensor layer (step 212). For example, the actuator/sensor layer 110 can be etched using RIE or DRIE to form sensors such as accelerometers, gyroscopes, pressure sensors, and magnetic sensors, actuators such as atomic force microscopy (AFM) probe tips, micro mirrors, energy harvesters, resonators, motors, and passive programmable components such as Variable Capacitors, Inductors, Resistors, and RF switches or resonators. Optionally, patterning of the actuator/sensor layer 110 can include the formation or deposition of one or more layers, such as a reflective layer, over a portion of substantially all or the actuator/sensor layer or a magnetic/ferro-magnetic layer for actuating and sensing.

Figure 1G:
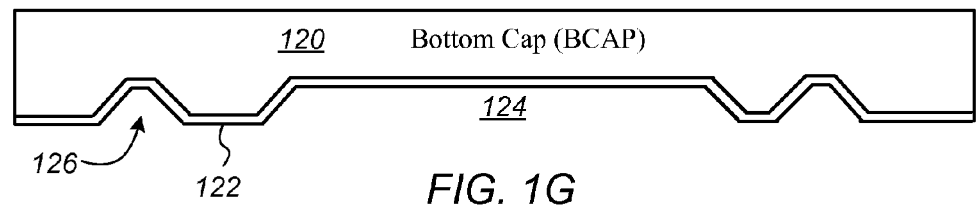

Referring to FIG. 1G and FIG. 2, a second substrate 120 is patterned and a bonding material 122, such as an oxide, deposited thereon to form a bottom cap (BCAP) (step 214). Generally, the second substrate 120 is patterned or etched using isotropic etching (e.g., KOH) or Anisotropic etching technique such as RIE or DRIE and standard photolithographic techniques to form a number of open cavities 124 to align with or correspond to the number of MEMS actuators or sensors formed in the actuator/sensor layer 110 and, optionally, a number of smaller openings 126 or concavities to correspond to the number of silicon vias 118.

Figure 1H:
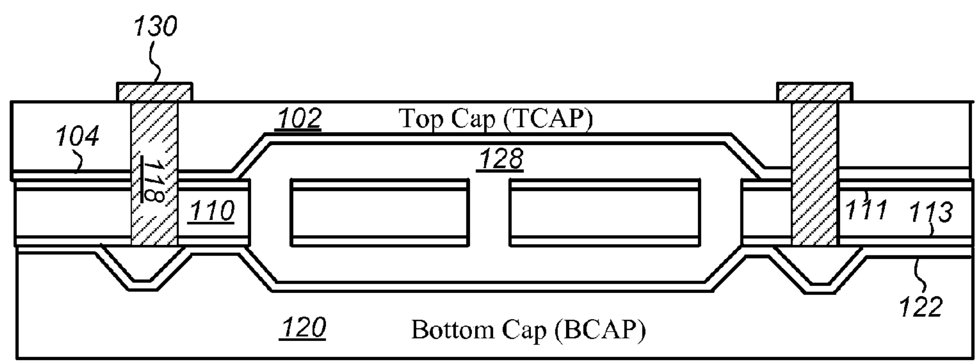

Referring to FIG. 1H and FIG. 2, the actuator/sensor layer 110 is bonded to the second substrate 120 or BCAP to form hermetically sealed cavities 128 around each of the number of MEMS actuators or sensors in the actuator/sensor layer at a wafer or substrate level (step 216). As described above with respect to bonding the first substrate 102 and the actuator/sensor layer 110, the bonding can be accomplished using fusion bonding, eutectic bonding, anodic bonding, polymer bonding, or glass frit bonding, depending on the materials of the second substrate 120 and the actuator/sensor layer, and on the application or function of the MEMS being fabricated. Thus, where the second substrate 120 is bonded to the actuator/sensor layer 110 using fusion bonding, and the bonding material 122 deposited can include a thin layer of one or more of $SiO_2$, Si or $Si_xN_y$, depending on the material of the actuator/sensor layer, to form a $SiO_2$ to $SiO_2$, $SiO_2$ to Si or $Si_xN_y$ to $Si_xN_y$, or $SiO_2$ to Si fusion bond. Where the second substrate 120 is bonded to the actuator/sensor layer 110 using eutectic or anodic bonding, polymer bonding, bonding materials deposited on the second substrate and/or the actuator/sensor layer can include aluminum (Al), copper (CU), gold (AU), germanium (Ge), tungsten (W), silicon (Si) or mixtures or alloys thereof. The structured form at this step would be a hermetically sealed actuator layer 110 that has a hermetically sealed, but conductive via connecting the actuator layer 110 to an electrical pad 130 used for wire bonding, chip scale package (CSP), or wafer level CSP.

Next, the TCAP (substrate 102) is thinned using lapping, grinding or CMP to expose the conductive materials in the silicon vias 118 (step 218), and conductive pads 130 formed over and electrically coupled to the exposed conductive material on a top surface of the TCAP (step 218). As with the layers and conductive material described above, the conductive pads 130 can be formed by evaporative or CVD of a metal or alloy, followed by patterning using standard photolithographic techniques.

Although the first substrate 102 and second substrate 120 are shown and described above as being patterned to form a number of open cavities, it will be understood that one or both may alternatively comprise a substantially planar surface that is subsequently bonded to the actuator/sensor layer 114. Generally, a cavity in BCAP and/or TCAP is desirable if the range of actuator motion is expected to be from about 1 to 99 μm, however, in certain applications in which the range of motion is expected to be less than about 99 nm there is no need to etch the TCAP or BCAP cavities, but rather just the films 104, 122, deposited thereon.

Figure 3A:
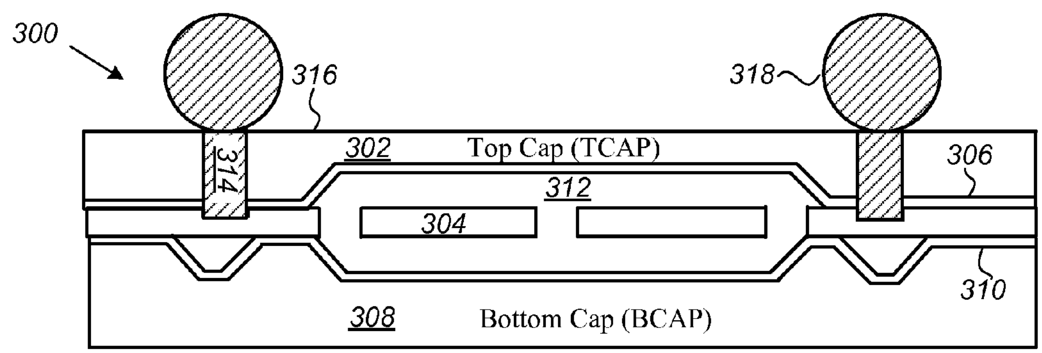
FIGS. 3A and 3B are block diagrams in sectional side view of MEMS having alternative contact structures according to other embodiments.
Figure 3B:
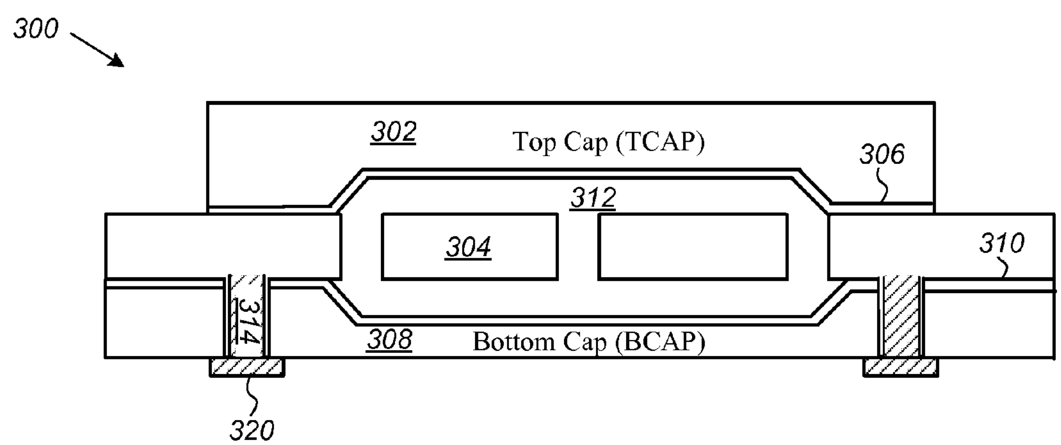

FIGS. 3A and 3B are block diagrams in sectional side view of MEMS or TASPs™ having alternative contact structures formed according to alternative embodiments of the above described method.

Referring to FIG. 3A, in a first embodiment the TASP™ or MEMS 300 includes a top cap 302 bonded to an actuator/sensor layer 304 using a bonding material 306, and a bottom cap 308 also bonded to the actuator/sensor layer using a bonding material 310 to form a hermetically sealed cavity 312 around a MEMS actuator or sensor at a wafer or substrate level. The MEMS 300 further includes silicon vias 314. In the embodiment shown, the silicon vias 314 do not extend fully gone thru the actuator/sensor layer 304, but rather stop on or in the actuator/sensor layer making electrical contact from the ball to the actuator layer. This can be accomplished by etching the silicon vias 314 from a top surface 316 of the top cap 302 to or partially into the actuator/sensor layer 304 bonded Thereto. It will be understood that MEMS can be fabricated up to this point by the method similar to that outlined in blocks 200 to 218 of FIG. 2 and described above. The structure of the MEMS 300 further differs from that of FIG. 1H in that the silicon vias 314 are overlaid by and electrically coupled to solder balls 318. This embodiment is particularly suitable for flip-chip or inverted mounting to a common lead frame with a CMOS IC in a multi-chip module (MCM) or package, or mounting directly to pads or contacts on top of a CMOS IC. In addition, the solder balls 318 can be formed at wafer level, hence enabling wafer level chip scale packaging (WLCSP). Both these embodiments are described in greater detail below.

Referring to FIG. 3B, in a second embodiment the TASP™ or MEMS 300 includes a top cap 302 bonded to an actuator/sensor layer 304 using a bonding material 306, and a bottom cap 308 also bonded to the actuator/sensor layer using a bonding material 310 to form a hermetically sealed cavity 312 around a MEMS actuator or sensor at a wafer or substrate level. The MEMS 300 further includes silicon vias 314, but differs from that of FIG. 1H in that the silicon vias 314 extend from the actuator/sensor layer 304 through the bottom cap 308 and electrically couple to pads 320 formed on a lower surface of the bottom cap.

Another method of fabricating and packaging a TASP™ or MEMS according to an alternative embodiment will now be described with reference to the block diagrams of FIGS. 4A-4J, and the flow chart of FIG. 5.

Figure 4A:
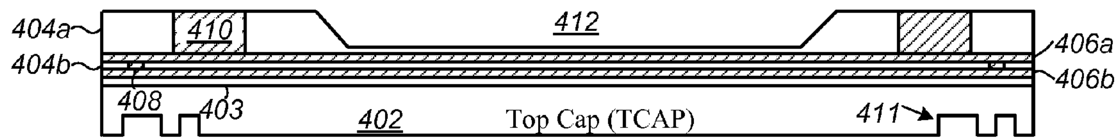
FIGS. 4A-4J are block diagrams in sectional side view of intermediate structures in the fabrication of a MEMS comprising multilayer oxide/metal contact structures according to another embodiment.
Figure 5:
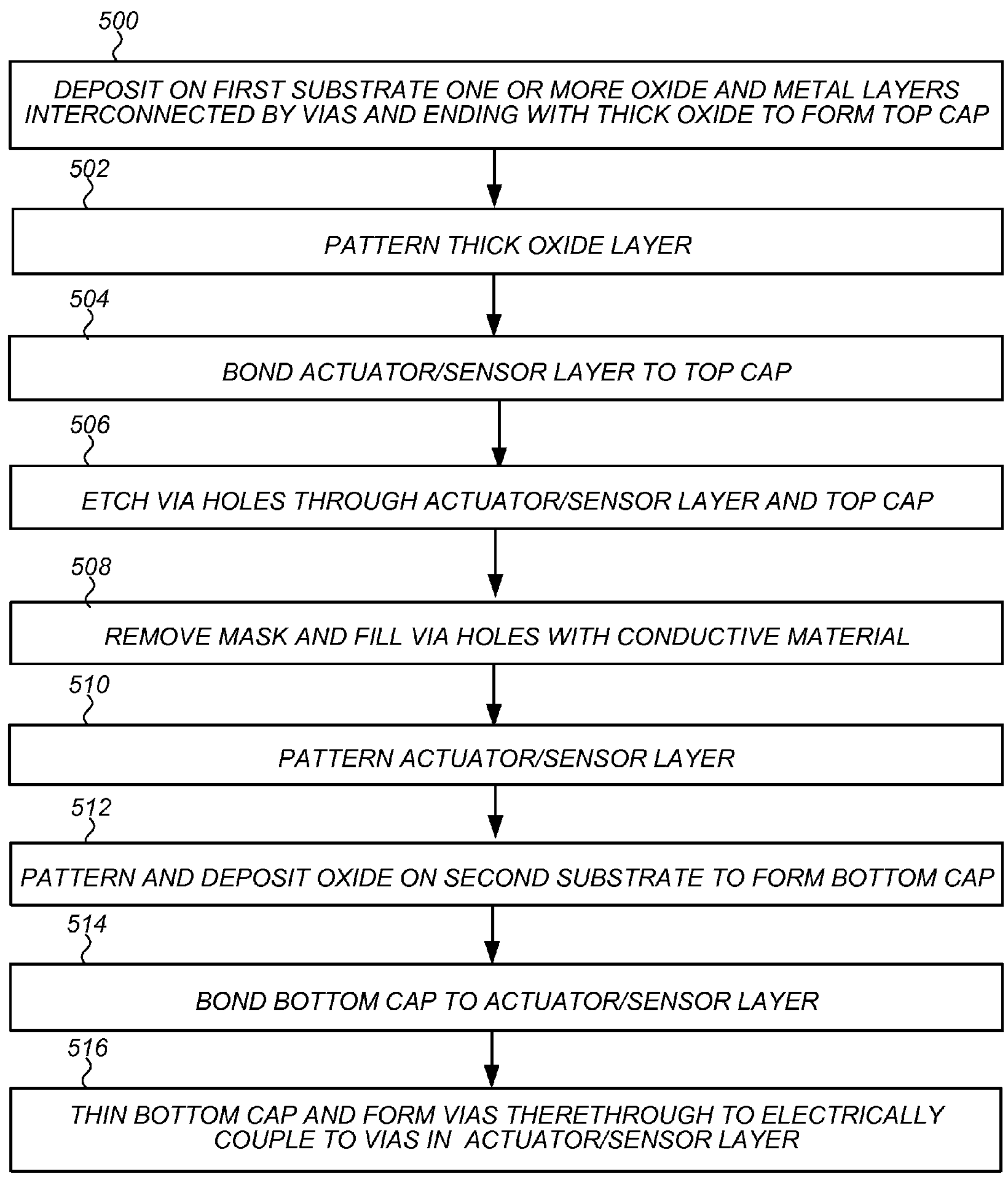
FIG. 5 is a flow chart illustrating a method for fabricating a MEMS FIGS. 4A-4J according to one embodiment.

Referring to FIG. 4A and FIG. 5, the method begins with depositing directly on a first substrate 402 or on an insulating or dielectric material 403, such as silicon-oxide or silicon-nitride, formed thereon one or more interleaved dielectric or oxide/insulator layers 404_a_, 404_b_ and metal layers 406_a_, 406_b_, the metal layers electrically coupled by one or more inter-level vias 408, and having a second via 410 extending from the top most metal layer 406_a_ through the thick, top oxide layer 404_a_ (step 500). Generally, the substrate 402 includes a number of alignment marks or features 411, and the oxide layers 404_a_, 404_b_, metal layers 406_a_, 406_b_ and vias 408, 410 can be deposited or formed using any of the deposition, standard photolithographic techniques and anisotropic etching or isotropic etching such as RIE or DRIE processes described above. Suitable conductor layers 406_a_, 406_b_, can include aluminum (Al), copper (CU), gold (AU), germanium (Ge), tungsten (W), doped silicon (Si) or mixtures or alloys thereof, and have individual thickness of from about 5 μm to about 60 μm. Suitable dielectric layers 404_a_, 404_b_ can include Si, $SiO_2$ and $Si_xN_y$.

Next, the thick, top most dielectric or oxide layer 404_a_, is patterned or etched using dry or wet etching and standard photolithographic techniques to etch a number of open cavities 412 to form a top cap (TCAP) (step 502).

Figure 4B:
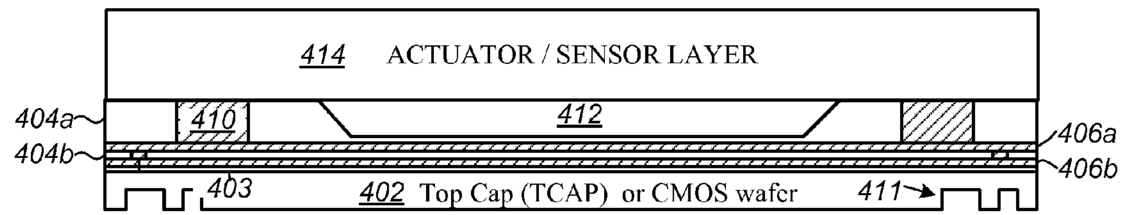

Referring to FIG. 4B and FIG. 5, an actuator/sensor layer 414 is bonded to the top cap 402 (step 504). As described above with respect to bonding the first embodiment the actuator/sensor layer 414 can be bonded to the top cap 402 using fusion bonding, eutectic bonding (e.g., Au/Si or Ti/Au/Si/Au, or Silicide bond, or GaAs/Si), anodic bonding, or glass frit, depending on the materials of the firs substrate 402 and the actuator/sensor layer, and on the application or function of the TASP™ or MEMS being fabricated. Because the actuator/sensor layer 414 is bonded to the top cap 402 substantially through the thick, top most oxide layer 404_a_, it is not necessary to deposit of form a layer of bonding material on the top cap prior to bonding. However, thin layers of bonding material (not shown) can be deposited on either or both the actuator/sensor layer 414 and the top cap 402 prior to bonding to form a desired $SiO_2$ to $SiO_2$, $SiO_2$ to Si or $Si_xN_y$ to $Si_xN_y$, or $SiO_2$ to Si fusion bond. Where the first substrate 402 is bonded to the actuator/sensor layer 414 using eutectic, or anodic bonding, bonding materials deposited on the substrate and/or the actuator/sensor layer can include aluminum (Al), copper (CU), gold (AU), germanium (Ge), tungsten (W), silicon (Si) or mixtures or alloys thereof.

Figure 4C:
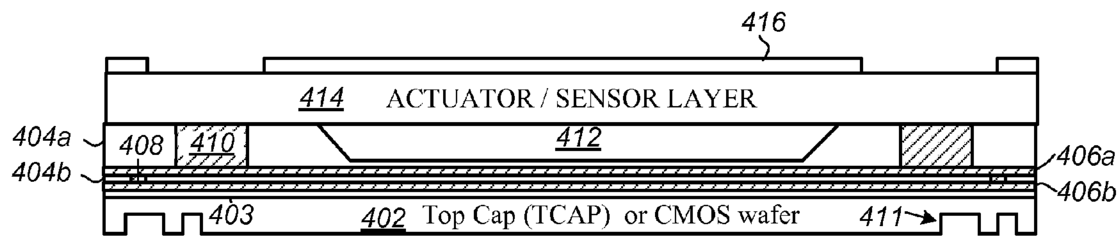
Figure 4D:
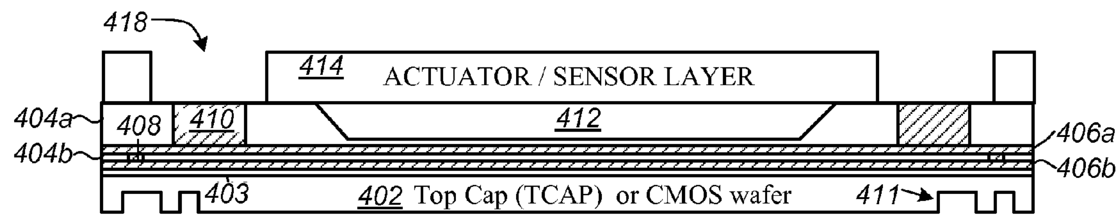

Referring to FIG. 4C and 4D, the actuator/sensor layer 414 is thinned, a patterned mask layer 416 formed thereon, and number of via openings or holes 418 are etched through the actuator/sensor layer, exposing one or more of the second vias 410 extending through the thick, top oxide layer 404*a* (step 506). The actuator/sensor layer 414 can be thinned, for example, by lapping, grinding or CMP. The mask layer 416 can formed from photoresist, oxide or nitride and patterned using standard photolithographic techniques.

Figure 4E:
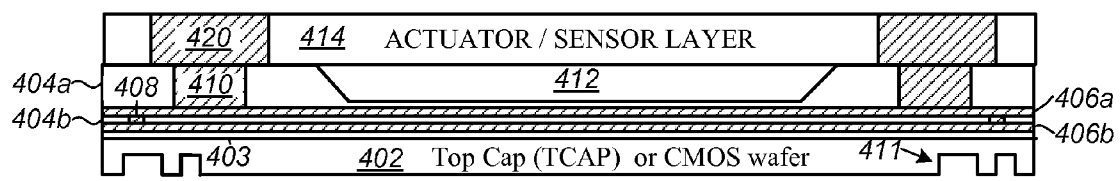

Referring to FIG. 4D and 4E, the mask layer 416 is removed and the via holes 418 are filled with a conductive material, such as a conductive paste, poly or a metal (step 508) to form a number of silicon vias 420 extending from the top metal layer 406*a* through the top most thick oxide layer 404*a* and the actuator/sensor layer 414. Metal can be deposited in the via holes 418, for example, by slurry, an evaporation or CVD processes. Optionally or preferably, the filling of the via holes 418 is preceded by deposition of a thin layer of a barrier metal, such as tungsten (W), Ti or TiN, over surfaces in the via holes, to enhance adhesion of the metal and prevent diffusion of metal into the surrounding layers.

Figure 4F:
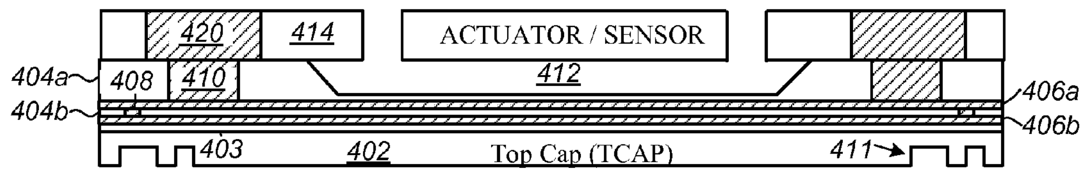

Referring to FIG. 4F and FIG. 5, the actuator/sensor layer 414 is patterned, thinned or micro-machined to form a number of MEMS actuators or sensors in the functional actuator/sensor layer (step 510). For example, the actuator/sensor layer 414 can by etched using RIE or DRIE to form sensors such as accelerometers, gyroscopes, pressure sensors, and magnetic sensors, actuators such as AFM probe tips, micro mirrors, energy harvesters, resonators, motors, and passive programmable components such as Variable Capacitors, Inductors, Resistors, and RF switches or resonators. Optionally, patterning of the actuator/sensor layer 414 can include the formation or deposition of one or more layers, such as a reflective layer, over a portion of substantially all or the actuator/sensor layer.

Figure 4G:
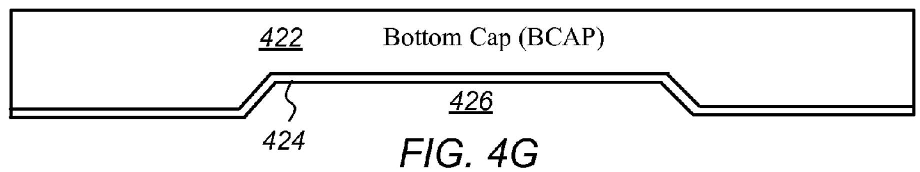

Referring to FIG. 4G and FIG. 5, a second substrate 422 is patterned and a bonding material 424, such as an oxide, deposited thereon to form a bottom cap (BCAP) (step 512). Generally, the second substrate 422 is patterned or etched using RIE or DRIE and standard photolithographic techniques to form a number of open cavities 426 that align with or correspond to the number of MEMS actuators or sensors formed in the actuator/sensor layer 414 and, optionally, a number of smaller openings 428 or concavities to correspond to the number of silicon vias 420.

Figure 4H:
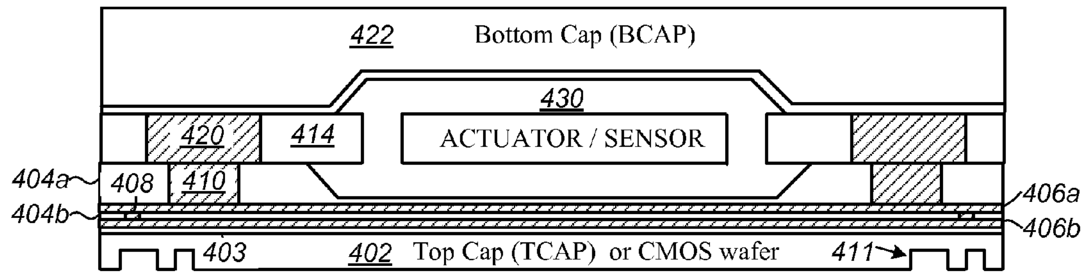
Figure 4I:
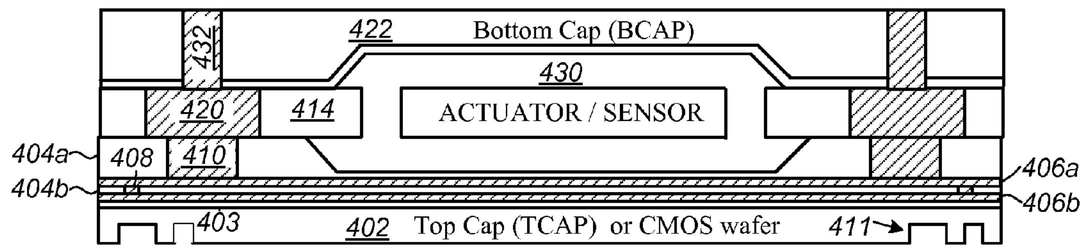

Referring to FIG. 4H and FIG. 5, the actuator/sensor layer 414 is bonded to the second substrate 422 or BCAP (step 514) to form hermetically sealed cavities 430 around each of the number of MEMS actuators or sensors in the actuator/sensor layer at a wafer or substrate level. As described above, the bonding can be accomplished using fusion bonding, eutectic bonding, polymer bonding, anodic bonding or glass frit, depending on the materials of the second substrate 422 and the actuator/sensor layer 414, and on the application or function of the TASP™ or MEMS being fabricated. Thus, where the second substrate 422 is bonded to the actuator/sensor layer 414 using fusion bonding, and the bonding material 424 deposited can include a thin layer of one or more of $SiO_2$, Si or $Si_xN_y$, depending on the material of the actuator/sensor layer, to form a $SiO_2$ to $SiO_2$, $SiO_2$ to Si or $Si_xN_y$ to $Si_xN_y$, or $SiO_2$ to Si fusion bond. Where the second substrate 422 is bonded to the actuator/sensor layer 414 using eutectic, Polymer bonding (e.g., SU-8), or anodic bonding, bonding materials deposited on the substrate and/or the actuator/sensor layer can include aluminum (Al), copper (Cu), gold (AU), germanium (Ge), tungsten (W), silicon (Si) or mixtures or alloys thereof.

Figure 4J:
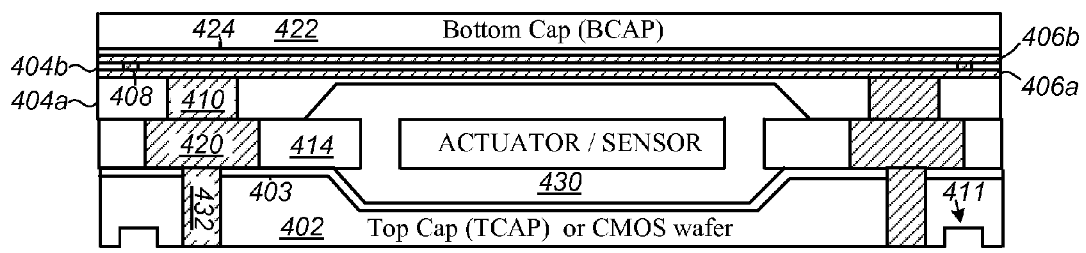

Next, the BCAP (substrate 422) is thinned using lapping, grinding or CMP processes and silicon vias 432 formed therethrough to electrically couple to the vias in the actuator/sensor layer 414 (step 516). Optionally, conductive pads or solder balls (not shown) can be formed over and electrically coupled to the exposed conductive material on a top surface of the BCAP. As with the silicon vias described above, the silicon vias 432 can be formed by patterning the BCAP using standard photolithographic techniques, followed by filling with a metal or alloy using evaporative or CVD. Also, it will be understood that the stack of oxide/insulator layers 404*a*, 404*b* and metal layers 406*a*, 406*b*, can be formed on the BCAP (substrate 422) prior to bonding to the actuator/sensor layer 414 (step 516) without departing from the scope of the present invention. An example of the finished MEMS according to this alternative embodiment is shown in FIG. 4J.

Figure 6A:
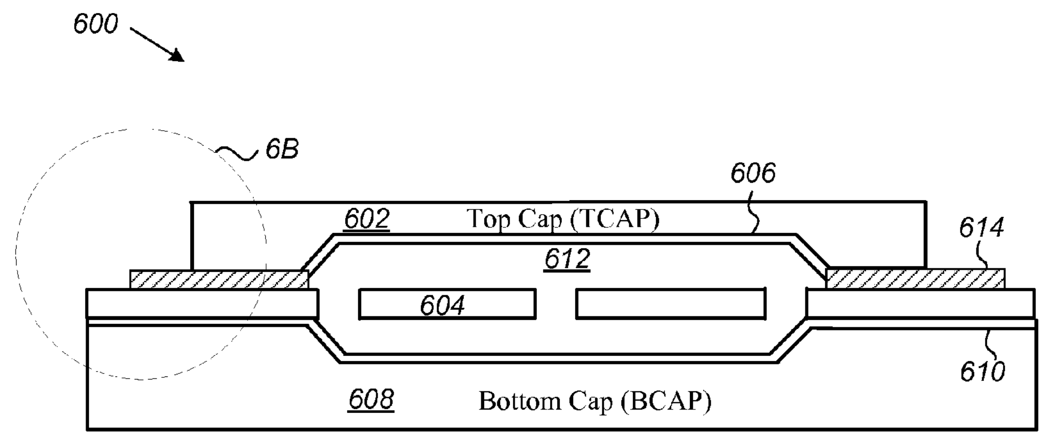
FIGS. 6A and 6B are block diagrams in sectional side view of a MEMS having hermetically sealed lateral contact structures according to another embodiment.
Figure 6B:
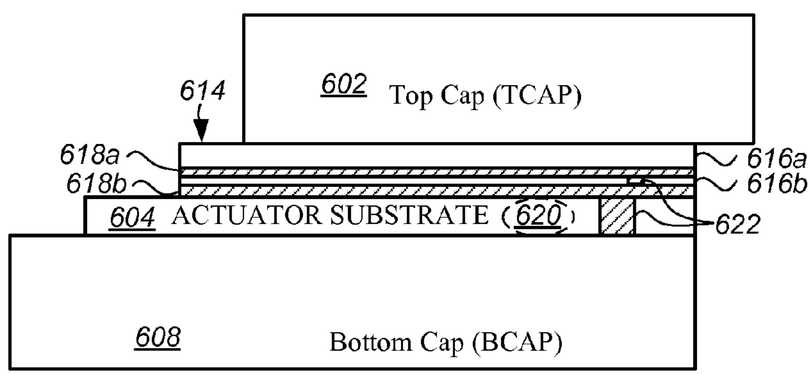

FIGS. 6A and 6B are block diagrams in sectional side view of a TASP™ or MEMS device having hermetically sealed lateral contact structures according to yet another embodiment. Referring to FIG. 6A, in this embodiment the MEMS 600 includes a top cap 602 bonded to an actuator/sensor layer 604 using a bonding material 606, and a bottom cap 608 also bonded to the actuator/sensor layer using a bonding material 610 to form a hermetically sealed cavity 612 around a MEMS actuator or sensor at a wafer or substrate level. The structure of the MEMS 600 differs from those described above in that it further includes a multilayer contact structure 614 formed between the actuator/sensor layer 604 and either the TCAP 602 or BCAP 608 and extends under a bond formed between the actuator/sensor layer and either the TCAP or BCAP. FIG. 6B shows a detail of the multilayer contact structure 614 of FIG. 6A. Referring to FIG. 6B, the multilayer contact structure 614 comprises one or more interleaved dielectric or oxide layers 616*a*, 616*b* and conductive or metal layers 618*a*, 618*b* electrically coupled to MEMS actuators or sensors in the actuator/sensor layer 604 through highly doped regions 620 of the actuator/sensor layer 604 to form metal to silicon Ohmic contact, and/or via(s) 622.

Yet another method of fabricating and packaging a TASP™ or MEMS according to an alternative embodiment will now be described with reference to the block diagrams of FIGS. 7A-7F, and the flow chart of FIG. 8.

Figure 7A:
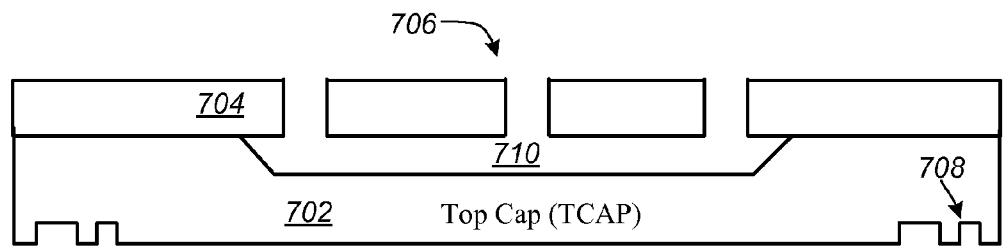
FIGS. 7A-7F are block diagrams in sectional side view of intermediate structures in the fabrication of a Micro-Electromechanical Systems (MEMS) comprising two substrates and conductive vias according to one embodiment.
Figure 8:
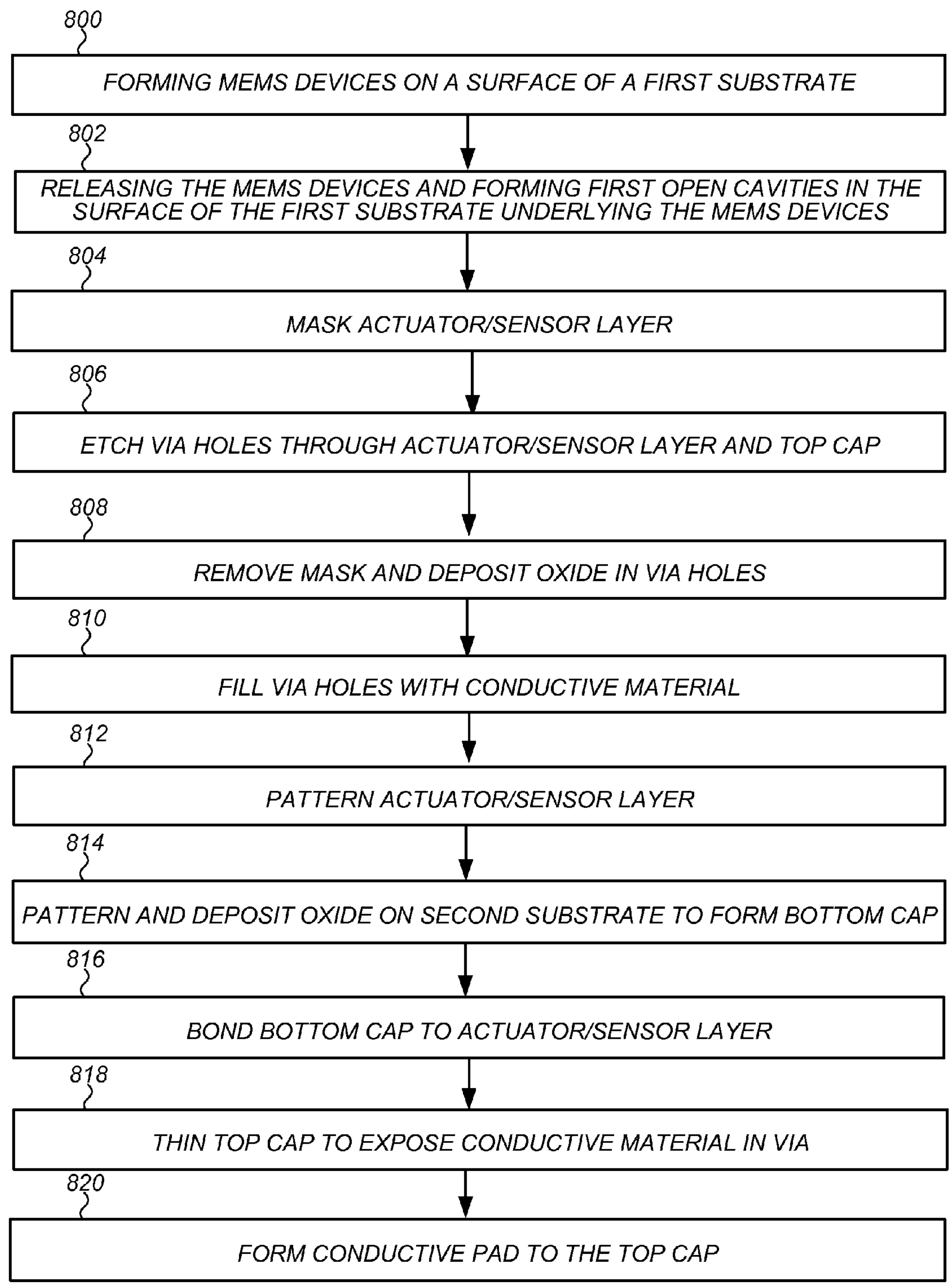
FIG. 8 is a flow chart illustrating a method for fabricating a MEMS of FIGS. 7A-7F according to one embodiment.

Referring to FIG. 7A and FIG. 8, the method begins with patterning a surface of a first substrate 702 to form an actuator/sensor layer 704 including a number of MEMS devices 706 with electrically conductive regions therein on the surface of the first substrate (step 800). For example, the actuator/sensor layer 704 can be etched using RIE or DRIE to form sensors such as accelerometers, gyroscopes, pressure sensors, and magnetic sensors, actuators such as atomic force microscopy (AFM) probe tips, micro mirrors, energy harvesters, resonators, motors, and passive programmable components such as Variable Capacitors, Inductors, Resistors, and RF switches or resonators. Optionally, patterning of the actuator/sensor layer 704 can include the formation or deposition of one or more layers, such as a reflective layer, over a portion of substantially all or the actuator/sensor layer or a magnetic/ferro-magnetic layer for actuating and sensing. Generally, the substrate 702 includes a number of alignment marks or features 708, and is patterned or etched using either an isotropic etching such as KOH or anisotropic etching such as RIE or DRIE and standard photolithographic techniques. Next, the surface of the first substrate 702 is further patterned or etched using highly selective etch, such as KOH or anisotropic etching, to release the MEMS devices 706 and form first open cavities 710 in the surface of the first substrate underlying the MEMS devices (step 802).

Figure 7B:
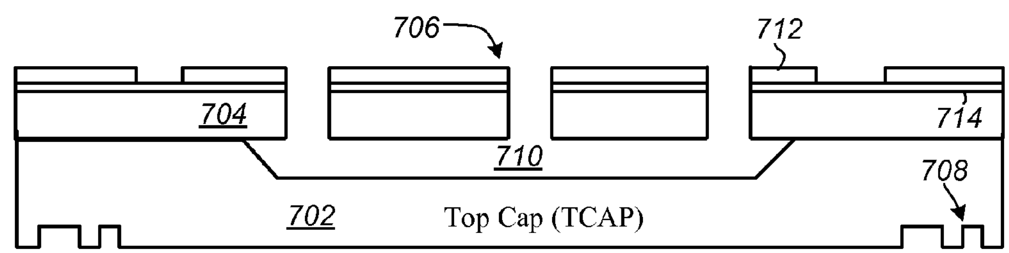
Figure 7C:
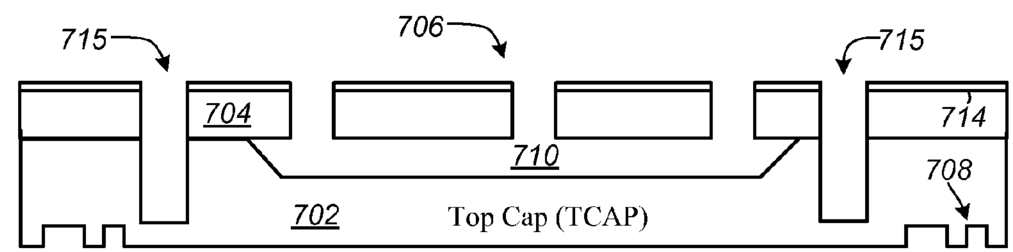

Referring to FIG. 7B and FIG. 8, the actuator/sensor layer 704 is thinned and a patterned mask layer 712 formed thereon (step 804). Optionally, as in the embodiment shown, prior to forming the mask layer 712 one or more layer of fusion bonding material 714 can formed on a surface of the actuator/sensor layer 704 that will face a second substrate or BCAP to facilitate bonding thereto. The actuator/sensor layer 704 can be thinned, for example, by lapping, grinding or CMP. The mask layer 712 can formed from photoresist, oxide or nitride and patterned using standard photolithographic techniques. Referring to FIG. 7C, a number of via openings or holes 715 are etched through the actuator/sensor layer 704 and into or substantially through the first substrate 702 or TCAP using RIE or DRIE (step 806). Next, the mask layer 712 is removed and an oxide liner 716 formed or deposited in the via holes 715 (step 808).

Figure 7D:
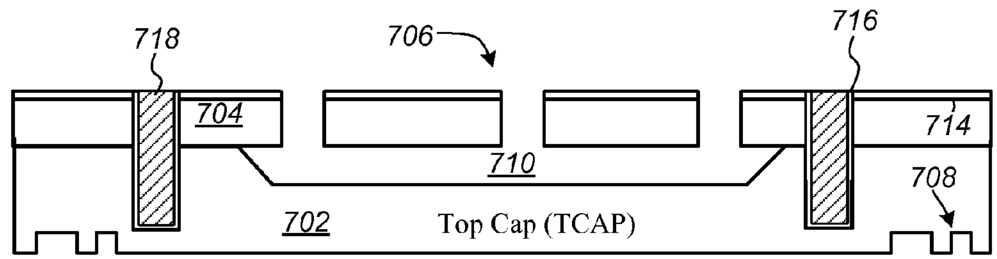

Referring to FIG. 7D and FIG. 8, the via holes 715 are filled with a conductive material, such as a conductive paste, polysilicon (poly) or a metal such as copper (step 810) to form a number of silicon vias 718 extending from electrically conductive regions in the actuator/sensor layer 704 and into or substantially through the first substrate 702 or TCAP. Metal can be deposited, for example, by an evaporation or chemical vapor deposition (CVD) process. Optionally or preferably, the filling of the via holes 715 is preceded by deposition of a thin layer of a barrier metal, such as tungsten (W), Ti or TiN, over the oxide 716 in the via holes.

Figure 7E:
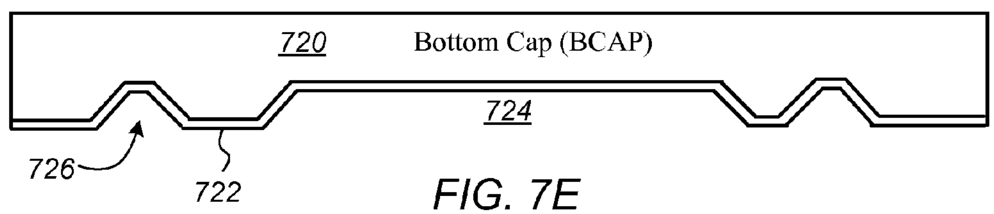

Referring to FIG. 7E and FIG. 8, a second substrate 720 is patterned and a bonding material 722, such as an oxide, deposited thereon to form a bottom cap (BCAP) (step 814). Generally, the second substrate 720 is patterned or etched using isotropic etching (e.g., KOH) or anisotropic etching technique such as RIE or DRIE and standard photolithographic techniques to form a number of second open cavities 724 to align with or correspond to the number of MEMS actuators or sensors formed in the actuator/sensor layer 704 and, optionally, a number of smaller openings 726 or concavities to correspond to the number of silicon vias 718.

Figure 7F:
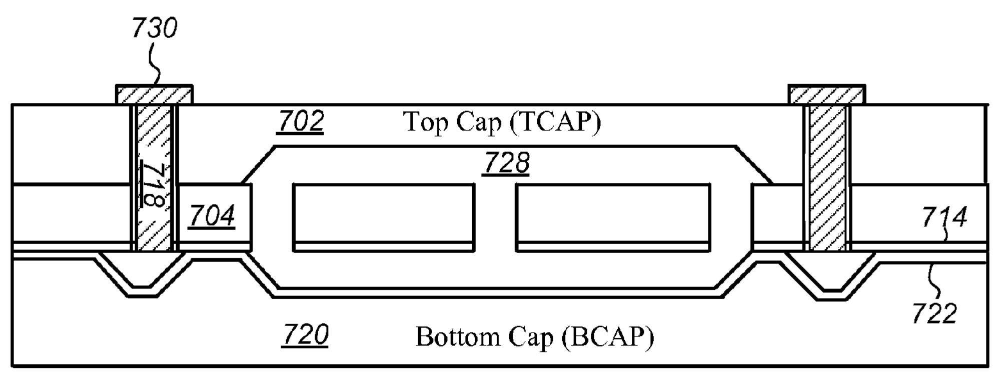

Referring to FIG. 7F and FIG. 8, the actuator/sensor layer 704 is bonded to the second substrate 720 or BCAP to form hermetically sealed cavities 728 around each of the number of MEMS devices 706 in the actuator/sensor layer at a wafer or substrate level (step 816). As with the embodiments described above, the bonding can be accomplished using fusion bonding, eutectic bonding, anodic bonding, polymer bonding, or glass frit bonding, depending on the materials of the second substrate 720 and the actuator/sensor layer 704, and on the application or function of the MEMS device 706 being fabricated. Thus, where the second substrate 720 is bonded to the actuator/sensor layer 704 using fusion bonding, and the bonding material 722 deposited can include a thin layer of one or more of $SiO_2$, Si or $Si_xN_y$, depending on the material of the actuator/sensor layer, to form a $SiO_2$ to $SiO_2$, $SiO_2$ to Si or $Si_xN_y$ to $Si_xN_y$, or $SiO_2$ to Si fusion bond. Where the second substrate 720 is bonded to the actuator/sensor layer 704 using eutectic or anodic bonding, polymer bonding, bonding materials deposited on the second substrate and/or the actuator/sensor layer can include aluminum (Al), copper (CU), gold (AU), germanium (Ge), tungsten (W), silicon (Si) or mixtures or alloys thereof.

Next, the TCAP (substrate 702) is thinned using lapping, grinding or CMP to expose the conductive materials in the silicon vias 718, and conductive pads 730 formed over and electrically coupled to the exposed conductive material on a top surface of the TCAP (step 818). As with the layers and conductive material described above, the conductive pads 730 can be formed by evaporative or CVD of a metal or alloy, followed by patterning using standard photolithographic techniques.

Although the first substrate 702 and second substrate 720 are shown and described above as being patterned to form a number of open cavities, it will be understood that one or both may alternatively comprise a substantially planar surface adjacent to the actuator/sensor layer 704. Generally, a cavity in BCAP and/or TCAP is desirable if the range of actuator motion is expected to be from about 1 to 99 μm, however, in certain applications in which the range of motion is expected to be less than about 99 nm there is no need to etch the TCAP or BCAP cavities, but rather just a film, such as bonding material 722, deposited thereon.

FIGS. 9A-9D are block diagrams in sectional side view of alternative embodiments of multi-chip modules (MCM) or packages including a CMOS IC and a TASP™ or MEMS device fabricated/packaged according to the above described method(s).

Figure 9A:
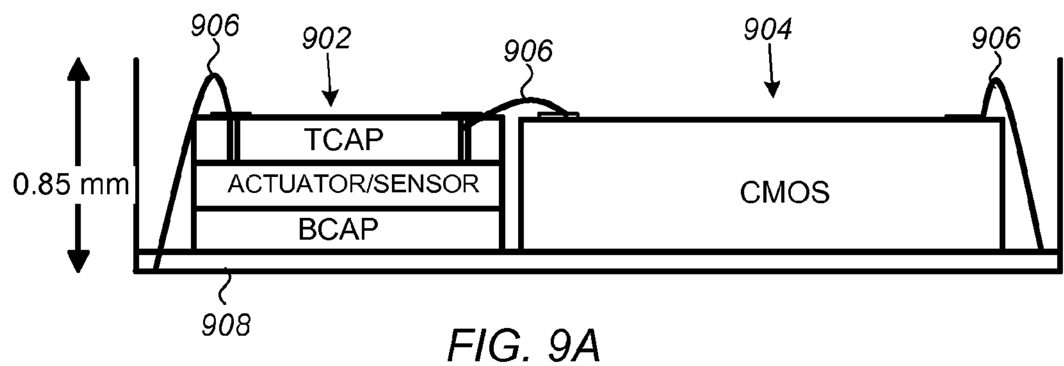
FIGS. 9A-9D are block diagrams in sectional side view of embodiments of multi-chip modules (MCM) or packages including a complementary metal oxide semiconductor integrated circuit (CMOS IC) and MEMS according to the present invention.

Referring to FIG. 9A, in a first embodiment a MEMS 902 is mounted side-by-side with a CMOS IC 904 in a Quad Flat No-leads (QFN) package. The MEMS 902 is electrically coupled or attached by wire-bonds 906 from silicon vias in a TCAP to the CMOS IC 904 and a lead-frame or back-plane 908 in the QFN package. It is noted that this embodiment advantageously reduces the overall height of the packaged MEMS and CMOS IC to less than about 0.85 mm.

Figure 9B:
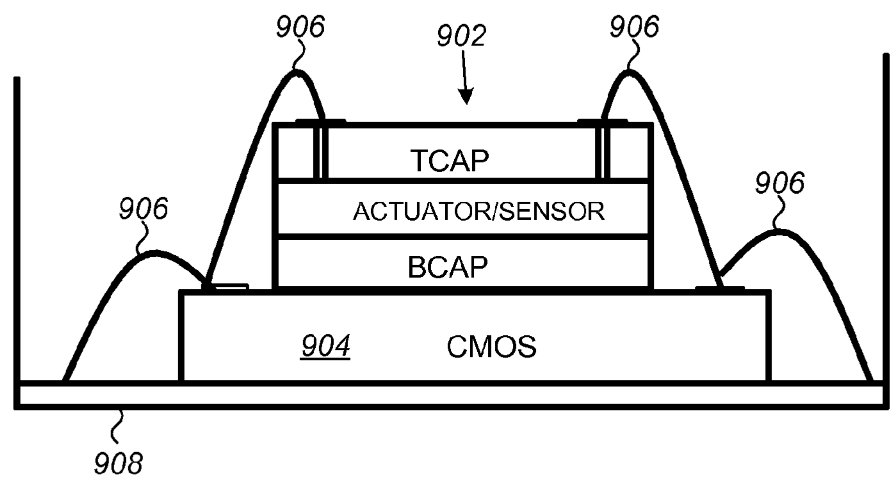

Referring to FIG. 9B, in a second embodiment the MEMS 902 is dual-die stacked with the CMOS IC 904 in a QFN package. The MEMS 902 is electrically coupled or attached by wire-bonds 906 from silicon vias in a TCAP to the CMOS IC 904 and to the back-plane 908 in the QFN package.

Figure 9C:
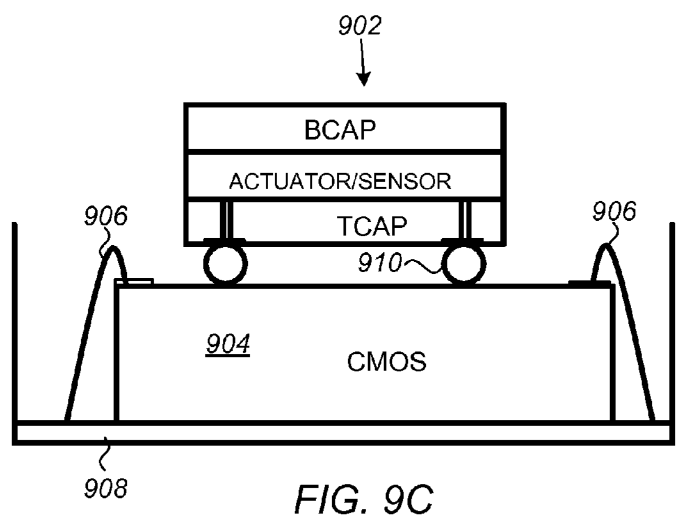

Referring to FIG. 9C, in a third embodiment the MEMS 902 is directly electrically coupled and attached by WLCSP (wafer level chip-scale-package) solder balls 910 to the CMOS IC 904, which is electrically coupled and attached by wire-bonds 906 to the back-plane 908 in the QFN package.

Figure 9D:
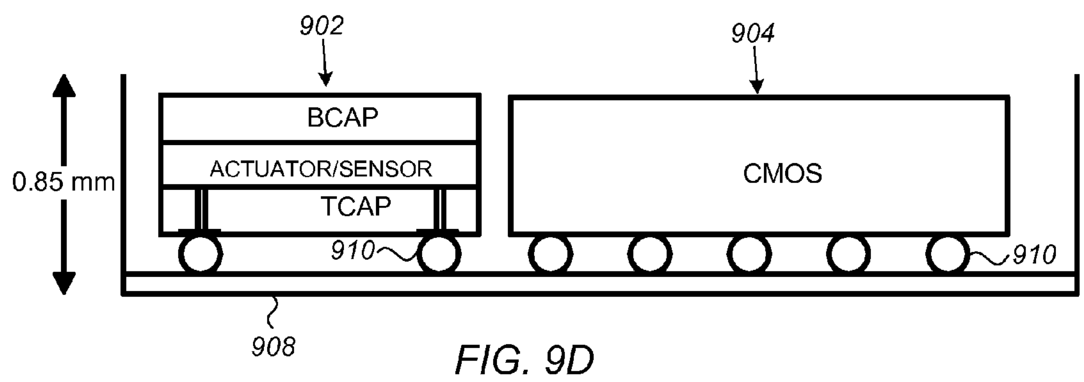

Referring to FIG. 9D, in a fourth embodiment the MEMS 902 is mounted side-by-side with a CMOS IC 904 in a QFN package by WLCSP solder balls 910 to the back-plane 908. Again, it is noted that this embodiment advantageously reduces the overall height of the packaged MEMS and CMOS IC to less than about 0.85 mm.

Figure 10A:
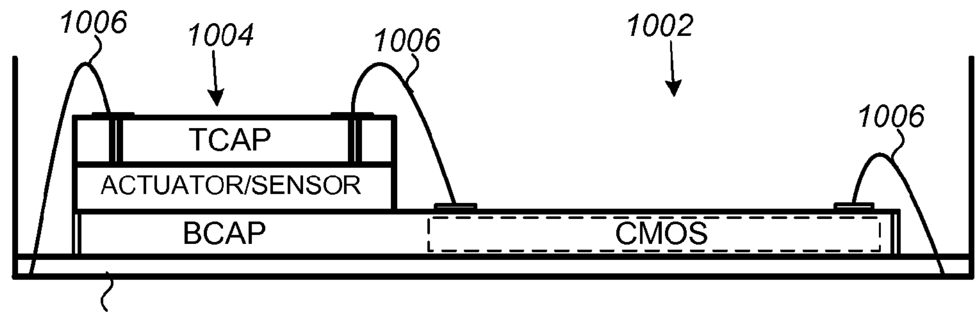
FIGS. 10A-10F are block diagrams in sectional side view of embodiments of a MEMS including a CMOS IC formed in a bottom cap (BCAP) thereof according to the present invention.
Figure 10B:
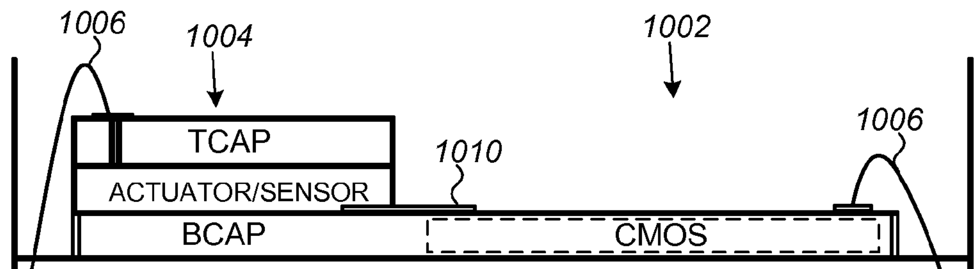
Figure 10C:
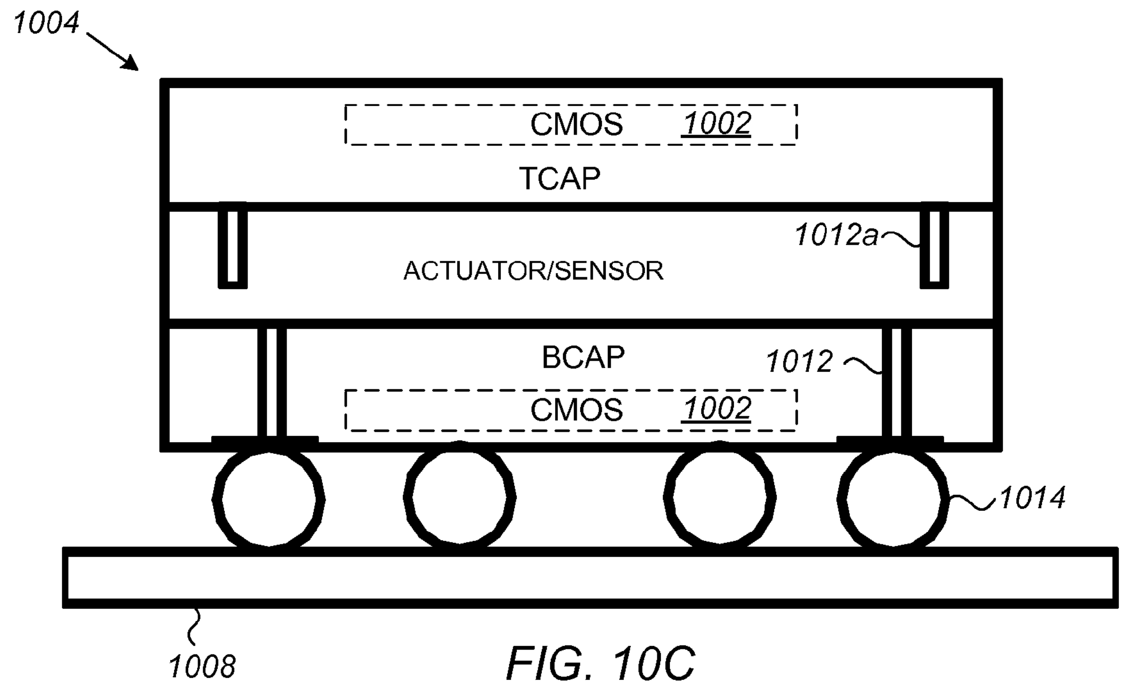

FIGS. 10A-10C are block diagrams in sectional side view of embodiments of a MEMS including a CMOS IC formed in bottom cap (BCAP) thereof according to the present invention.

Referring to FIG. 10A, in a first embodiment the CMOS IC 1002 is integrally formed adjacent to a MEMS 1004 on a surface of a shared silicon or CMOS substrate before or after fabrication of the MEMS. For example in one version of this embodiment, the CMOS IC 1002 is formed after the MEMS 1004 has been fully formed and packaged in a WLCSP according to one of the methods described above on a substrate from which a TCAP or BCAP of the MEMS is formed. The MEMS 1004 is electrically coupled or attached by wire-bonds 1006 from silicon vias in the TCAP to the CMOS IC 1002 and a lead-frame or back-plane 1008 in, for example, a QFN package.

In another embodiment, shown in FIG. 10B, the MEMS 1004 is electrically coupled or attached to the CMOS IC 1002 by a lateral contact structure 1010 extending from a hermetically sealed cavity between the actuator/sensor layer and the second substrate or BCAP. As described above with reference to FIG. 6B, the lateral contact structure 1010 comprises one or more interleaved dielectric and conductive layers and/or via(s) electrically coupled to MEMS devices in the actuator/ sensor layer through highly doped regions of the actuator/sensor layer to form metal to silicon Ohmic contact.

In yet another embodiment, shown in FIG. 10C, the MEMS 1004 is electrically coupled or attached to the CMOS IC 1002 formed in the BCAP (or TCAP) by a silicon vias 1012 extending from highly doped regions of the actuator/sensor layer through the BCAP and/or by additional silicon vias 1012*a* extending from the CMOS IC 1002 in the TCAP to the highly doped regions of the actuator/sensor layer. As described above with reference to FIG. 9D, the CMOS IC 1002 and the MEMS 1004 electrically coupled or attached to a lead-frame or back-plane 1008 by WLCSP solder balls 1014.

Figure 10D:
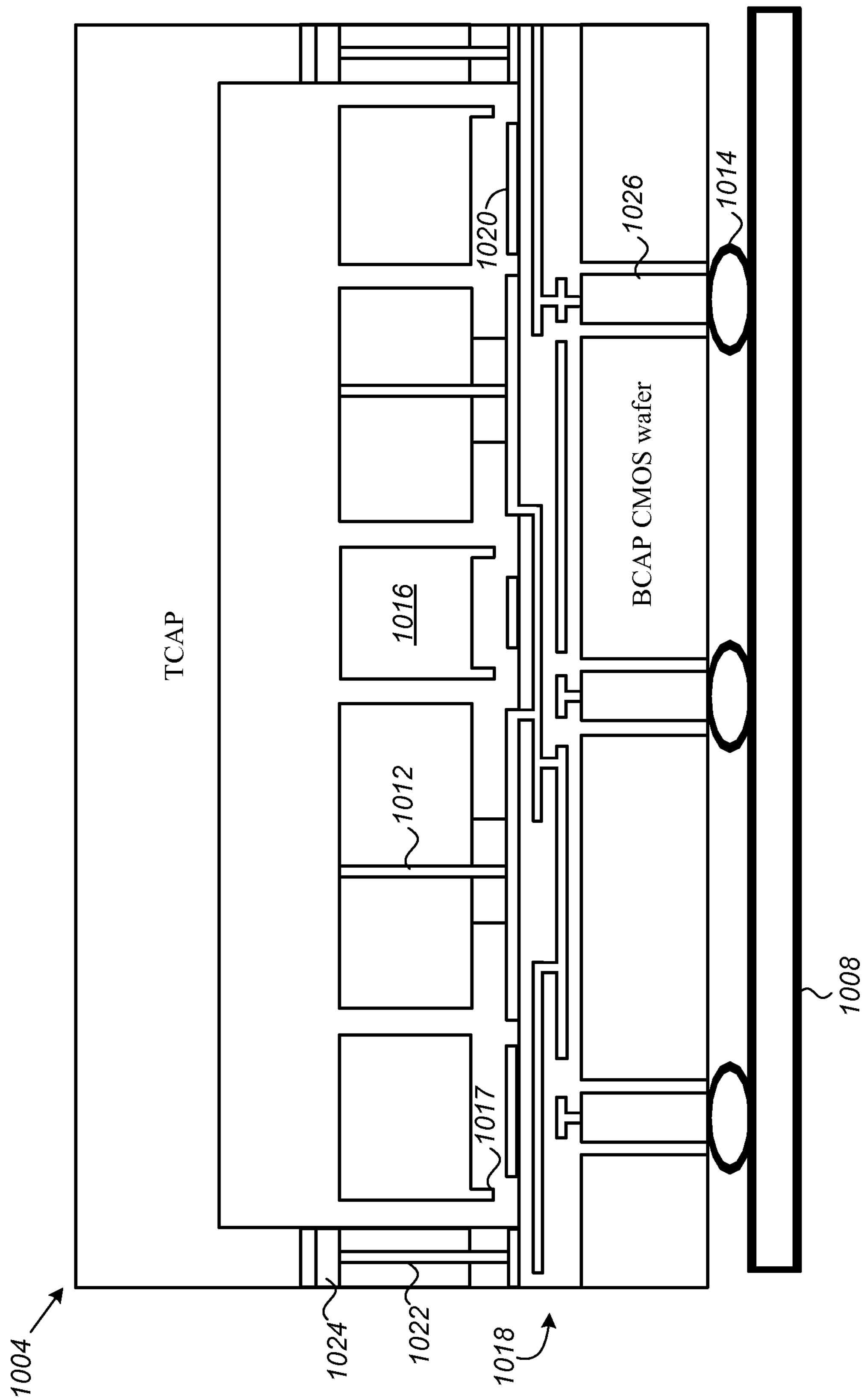

Referring to FIG. 10D, in another embodiment the BCAP comprises a CMOS wafer or substrate, bonded to the TCAP to form a WLCSP according to one of the methods described above, and the actuator/sensor layer 1016 of the MEMS 1004 is electrically coupled or attached by silicon vias 1012 extending from a CMOS interconnect 1018 formed in or on the BCAP to electrically conducting regions in the actuator/sensor layer. The CMOS interconnect 1018 can includes a number of conducting elements, insulating elements and active CMOS circuit elements to drive and/or receive signals from the actuator/sensor layer 1016. These elements can include drive and/or sense electrodes 1020 formed on top of the CMOS interconnect 1018. The MEMS 1004 can further include vias 1022 electrically coupling the CMOS interconnect 1018 to active or passive circuit elements 1024 in the TCAP. Finally, the actuator/sensor layer 1016 is further electrically coupled through the CMOS IC interconnect 1018 by additional silicon vias 1026 formed in the BCAP and extending from through the BCAP to a lead-frame or back-plane 1008 by WLCSP solder balls 1014. Further, the actuator layer 1016 has anti-collision extrusions 1017 (shown as rabbit ear underneath) to prevent stiction and limit the actuator layer travel range.

Figure 10E:
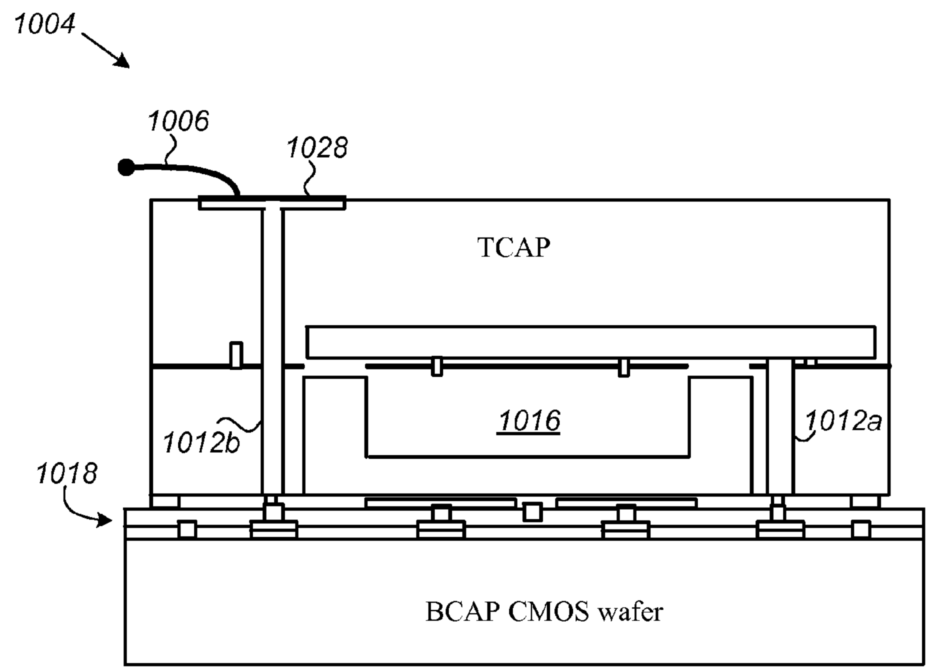

In another embodiment, shown if FIG. 10E, the actuator/sensor layer 1016 of the MEMS 1004 is electrically coupled by first silicon vias 1012*a* to a CMOS interconnect 1018 formed in or on a CMOS wafer or BCAP, and through the CMOS interconnect to second silicon vias 1012*b* that extend through the actuator/sensor layer and TCAP to pads 1028 on top of the TCAP. The MEMS 1004 is electrically coupled or attached to external circuits or devices by wire-bonds 1006 to the pad 1028.

Figure 10F:
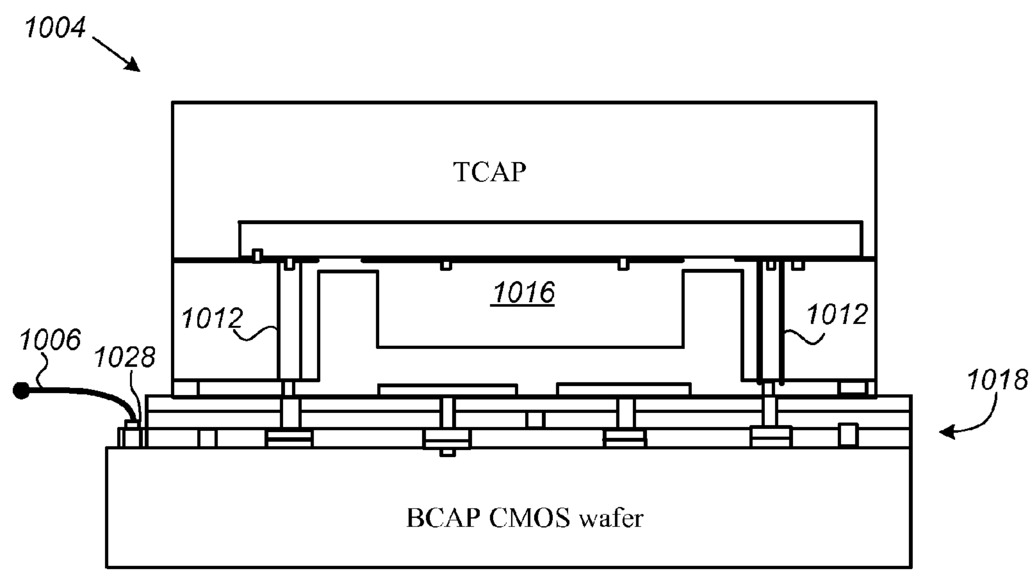

In still another embodiment shown if FIG. 10F, the MEMS 1004 differs from that shown in FIG. 10E and described above in that CMOS interconnect 1018 extends under a bond formed between the actuator/sensor layer and the BCAP, and includes a lateral contact or pad 1028 through which the MEMS 1004 is electrically coupled or attached to external circuits or devices by wire-bonds 1006.

In still another embodiment shown if FIG. 10F, the MEMS 1004 differs from that shown in FIG. 10E and described above in that CMOS interconnect 1018 extends under a bond formed between the actuator/sensor layer and the BCAP, and includes a lateral contact or pad 1028 through which the MEMS 1004 is electrically coupled or attached to external circuits or devices by wire-bonds 1006.

Figure 11A:
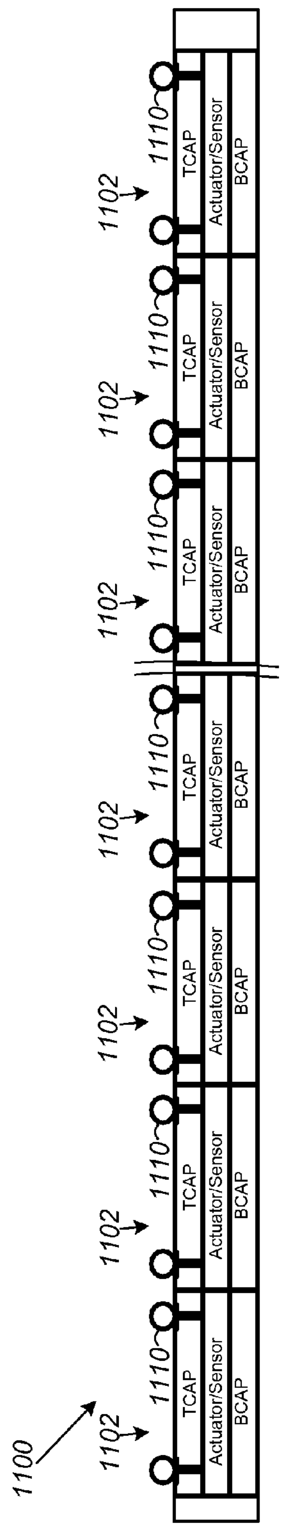
FIGS. 11A and 11B are block diagrams illustrating an un-diced substrate or wafer in or on which are formed a plurality MEMS according to the present invention.
Figure 11B:
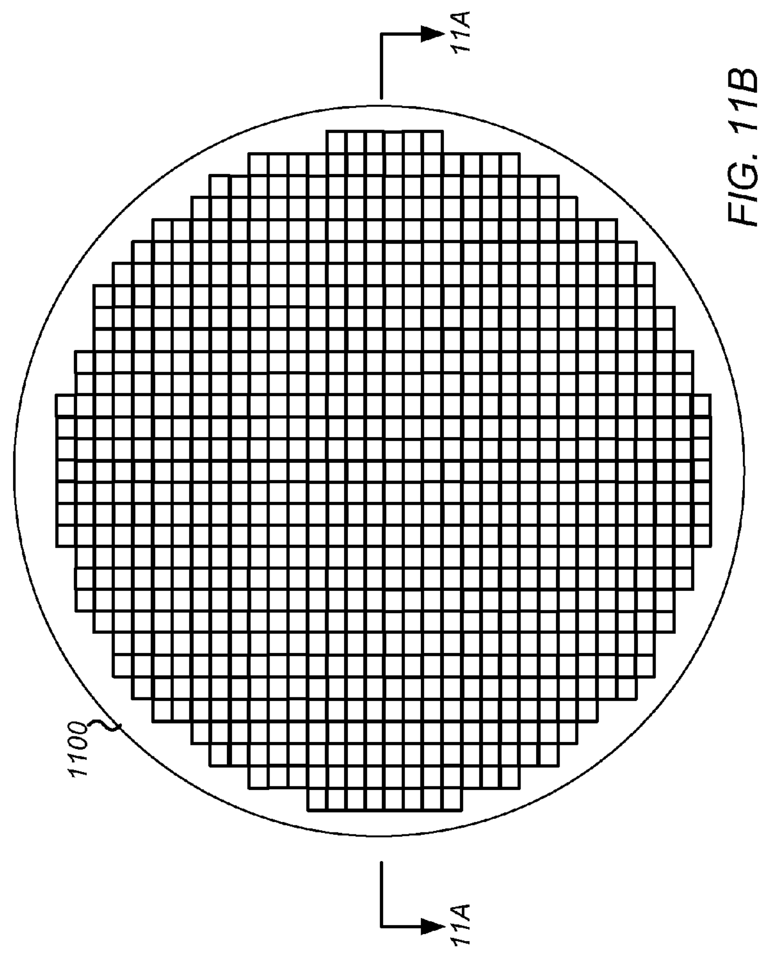

FIG. 11A is a block diagram in cross-sectional side view illustrating an un-diced or un-singulated substrate or wafer 1100 in or on which are formed a plurality of TASPs™ or MEMS 1102 comprising WLCSP solder balls 1110. FIG. 11B is a top or plan view of the undiced wafer 1100. It should be noted that FIG. 11A is not shown to scale. In particular, the wafer 1100 in FIG. 11A has been divided such that the thickness thereof is exaggerated relative to the diameter in order to show details of the MEMS 1102.

Figure 12:
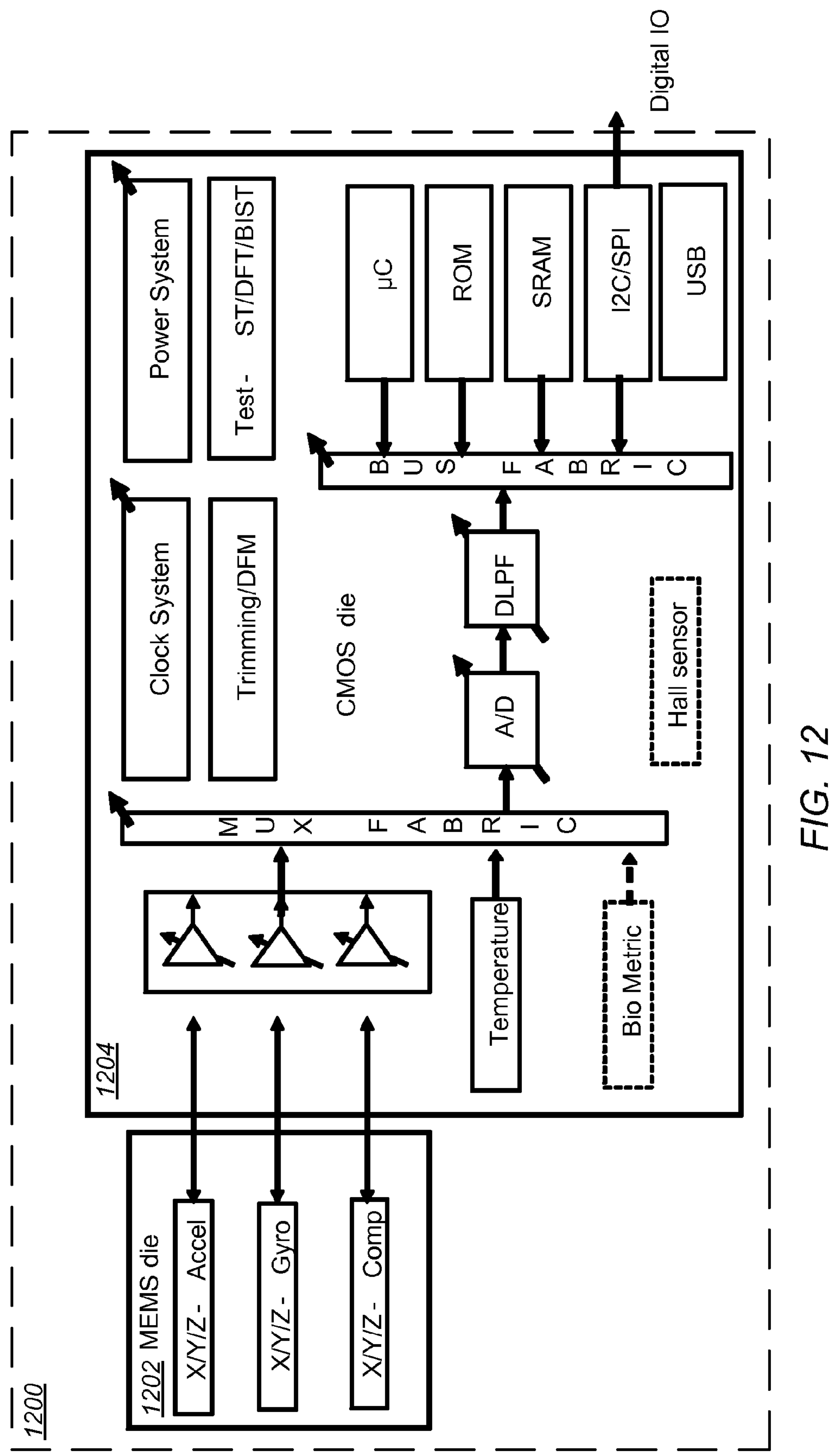
FIG. 12 is a block diagram of an exemplary system including an integrally packaged MEMS CMOS IC and MEMS according to the present invention.

FIG. 12 is a block diagram of an exemplary system including an integrally packaged MEMS CMOS IC and a TASP™ or MEMS according to the present invention. In particular, FIG. 12 illustrates a system 1200 including an integrally packaged MEMS 1200 including a 3-axis accelerometer, a 3-axis gyroscope and a 3-axis magnetometer, and supporting circuitry on a CMOS IC 1204 for driving actuators and sensors in the MEMs and reading sensed signals or values from the same.

Thus, embodiments of methods and structures for fabricating and packaging MEMS actuators and/or sensors at the wafer or substrate level have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

In the forgoing description, for purposes of explanation, numerous specific details have been set forth in order to provide a thorough understanding of the control system and method of the present disclosure. It will be evident however to one skilled in the art that the present interface device and method may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the control system or method. The appearances of the phrase "one embodiment" in various places in the specification do not necessarily all refer to the same embodiment. The term "to couple" as used herein may include both to directly electrically connect two or more components or elements and to indirectly connect through one or more intervening components.

What is claimed is:

1. A method comprising:

forming a number of first open cavities in a surface of a first substrate and a number of second open cavities in a surface of a second substrate corresponding to the first open cavities;

forming an actuator/sensor layer including a number of Micro-Electromechanical System (MEMS) devices with electrically conductive regions therein;

bonding the first substrate and the second substrate to the actuator/sensor layer so that at least one of the number of the first and second open cavities align with at least one of the number of MEMS devices to form a hermetically sealed cavity around the MEMS; and electrically connecting the electrically conductive regions of the MEMS device to a pad outside of the sealed cavity through an electrical interconnect.

2. The method of claim 1, wherein bonding the first substrate and the second substrate to the actuator/sensor layer comprises one or more of fusion bonding, eutectic bonding, anodic bonding and glass frit bonding to form the hermetically sealed cavity around the MEMS.

3. The method of claim 2, wherein the electrical interconnect comprises a lateral contact structure in contact with the electrically conductive regions of the MEMS device extending from the hermetically sealed cavity between the actuator/sensor layer and the first or second substrate, and wherein electrically connecting the electrically conductive regions of the MEMS device to a pad outside of the sealed cavity comprises exposing a portion of the lateral contact structure.

4. The method of claim 3, wherein bonding the first substrate and the second substrate to the actuator/sensor layer further comprises hermetically sealing the lateral contact structure to the actuator/sensor layer and the first and second substrate.

5. The method of claim 3, wherein the lateral contact is a multilayer contact structure comprising one or more interleaved dielectric layers and conductive layers.

6. The method of claim 2, wherein electrically connecting the electrically conductive regions of the MEMS device to a pad outside of the sealed cavity comprises forming a silicon via through either the first or second substrate to the electrically conductive regions of the MEMS device.

7. The method of claim 2, wherein electrically connecting the electrically conductive regions of the MEMS device to a pad outside of the sealed cavity comprises forming a silicon via through either the first or second substrate to a lateral contact structure in contact with the electrically conductive regions of the MEMS device extending from the hermetically sealed cavity between the actuator/sensor layer and the first or second substrate.

8. The method of claim 2, wherein fusion bonding comprises forming fusion bonds between layers formed on the first substrate, the second substrate and the actuator/sensor layer and comprising one or more of silicon, silicon-dioxide or silicon-nitride.

9. The method of claim 1, further comprising dicing the bonded first substrate, the actuator/sensor layer and second substrate to form individual MEMS packaged with wafer level chip scale packaging (WLCSP).

10. The method of claim 9, further comprising wire bonding the pad to a complementary metal oxide semiconductor (CMOS) die and packaging individual MEMS and CMOS die in a multi-die package.

11. The method of claim 1, wherein at least one of the first or second substrates further includes a complementary metal oxide semiconductor (CMOS) integrated circuit (IC), and wherein electrically connecting the electrically conductive regions of the MEMS device to a pad outside of the sealed cavity comprises electrically connecting the electrically conductive regions of the MEMS device through the CMOS IC.

12. A method comprising:

forming a number of Micro-Electromechanical System (MEMS) devices including electrically conductive regions therein on a surface of a first substrate;

forming a number of first open cavities in the surface of the first substrate underlying the number of MEMS devices;

forming a number of second open cavities in a surface of a second substrate corresponding to the first open cavities; and aligning the first substrate to the second substrate so that at least one of the number of the first and second open cavities align with at least one of the number of MEMS devices;

hermetically sealing the cavity around the MEMS device by bonding the first substrate to the second substrate; and electrically connecting the electrically conductive regions of the MEMS device to a pad outside of the sealed cavity through an electrical interconnect.

13. The method of claim 12, wherein the electrical interconnect comprises a lateral contact structure in contact with the electrically conductive regions of the MEMS device extending from the hermetically sealed cavity between the first and second substrate, and wherein electrically connecting the electrically conductive regions of the MEMS device to a pad outside of the sealed cavity comprises exposing a portion of the lateral contact structure.

14. The method of claim 12, wherein electrically connecting the electrically conductive regions of the MEMS device to a pad outside of the sealed cavity comprises forming a silicon via through either the first or second substrate to the electrically conductive regions of the MEMS device.

15. The method of claim 12, forming the number of first open cavities in the surface of the first substrate is performed concurrently with forming the number of MEMS devices using an etching process.

16. The method of claim 12, wherein at least one of the first or second substrates further includes a complementary metal oxide semiconductor (CMOS) integrated circuit (IC), and wherein electrically connecting the electrically conductive regions of the MEMS device to a pad outside of the sealed cavity comprises electrically connecting the electrically conductive regions of the MEMS device through the CMOS IC.

17. A method comprising:

etching a number of first open cavities in a surface of a first substrate to form a top cap (TCAP);

forming an actuator/sensor layer including a number of Micro-Electromechanical System (MEMS) devices with electrically conductive regions therein;

bonding the first substrate to the actuator/sensor layer so that at least one of the number of the first open cavities aligns with at least one of the number of MEMS devices;

etching a number of second open cavities in a surface of a second substrate corresponding to the first open cavities to form a bottom cap (BCAP);

bonding the second substrate to the actuator/sensor layer so that at least one of the number of the second open cavities align with at least one of the number of MEMS devices and at least one of the first open cavities to form a sealed cavity around the MEMS device; and electrically connecting the electrically conductive regions of the MEMS device to a pad outside of the sealed cavity through an electrical interconnect, wherein at least one of the first or second substrates further includes a complementary metal oxide semiconductor (CMOS) integrated circuit (IC), and wherein electrically connecting the electrically conductive regions of the MEMS device to a pad outside of the sealed cavity comprises electrically connecting the electrically conductive regions of the MEMS device through the CMOS IC.

18. The method of claim 17, wherein bonding the first substrate and the second substrate to the actuator/sensor layer comprises one or more of fusion bonding, eutectic bonding, anodic bonding and glass frit bonding to form a hermetically sealed cavity around the MEMS.

19. The method of claim 18, wherein the electrical interconnect comprises a lateral contact structure in contact with the electrically conductive regions of the MEMS device extending from the hermetically sealed cavity between the actuator/sensor layer and the first or second substrate, and wherein electrically connecting the electrically conductive regions of the MEMS device to a pad outside of the sealed cavity comprises exposing a portion of the lateral contact structure.

20. The method of claim 18, wherein electrically connecting the electrically conductive regions of the MEMS device to a pad outside of the sealed cavity comprises forming a silicon via through either the first or second substrate to the electrically conductive regions of the MEMS device.

21. The method of claim 17, wherein the actuator/sensor layer comprises single crystalline silicon, and further comprising thinning the actuator/sensor layer to a thickness of 60 um or less prior to bonding the second substrate to the actuator/sensor layer.

22. The method of claim 21, further comprising forming anti-collision extrusions on the actuator layer to prevent stiction and limit the actuator layer travel range.

* * * * *